(12) United States Patent
Sharma et al.

(10) Patent No.: US 11,888,034 B2
(45) Date of Patent: Jan. 30, 2024

(54) TRANSISTORS WITH METAL CHALCOGENIDE CHANNEL MATERIALS

(71) Applicant: Intel Corporation, Santa Clara, CA (US)

(72) Inventors: Abhishek A. Sharma, Hillsboro, OR (US); Ashish Agarwal, Hillsboro, OR (US); Urusa Alaan, Hillsboro, OR (US); Christopher Jezewski, Portland, OR (US); Kevin Lin, Beaverton, OR (US); Carl Naylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1017 days.

(21) Appl. No.: 16/435,358

(22) Filed: Jun. 7, 2019

(65) Prior Publication Data
US 2020/0388685 A1    Dec. 10, 2020

(51) Int. Cl.
*H01L 29/26*     (2006.01)
*H01L 29/51*     (2006.01)
(Continued)

(52) U.S. Cl.
CPC ............ *H01L 29/26* (2013.01); *H01L 27/092* (2013.01); *H01L 29/16* (2013.01); *H01L 29/517* (2013.01)

(58) Field of Classification Search
CPC ....... H01L 29/16; H01L 29/26; H01L 29/517; H01L 29/42392; H01L 29/66795;
(Continued)

(56) References Cited

U.S. PATENT DOCUMENTS

| 6,140,672 A | 10/2000 | Arita et al. |
| 6,339,241 B1 | 1/2002 | Mandelman et al. |

(Continued)

FOREIGN PATENT DOCUMENTS

| KR | 20100053230 | 5/2010 |
| WO | 2018182607 | 10/2018 |

OTHER PUBLICATIONS

Kim, Se-Yang et al., "Recent Developments in Controlled Vapor-Phase Growth of Two-Dimensional Group 6 Transition Metal Dichalcogenides", Advanced Materials, vol. 31, Issue 20, Feb. 2019, 90 pgs.
(Continued)

*Primary Examiner* — Calvin Y Choi
(74) *Attorney, Agent, or Firm* — Essential Patents Group, LLP

(57) ABSTRACT

Transistor structures employing metal chalcogenide channel materials may be formed where a chalcogen is introduced into at least a portion of a precursor material that comprises reactive metal(s). The precursor material may be substantially metallic, or may be a metallic oxide (e.g., an oxide semiconductor). The metal(s) may be transition, Group II, Group III, Group V elements, or alloys thereof. An oxide of one or more such metals (e.g., IGZO) may be converted into a chalcogenide (e.g., $IGZS_x$ or $IGZSe_x$) having semiconducting properties. The chalcogenide formed in this manner may be only a few monolayers in thickness (and may be more thermally stable than many oxide semiconductors. Where not all of the precursor material is converted, a transistor structure may retain the precursor material, for example as part of a transistor channel or a gate dielectric. Backend transistors including metal chalcogenide channel materials may be fabricated over silicon CMOS circuitry.

19 Claims, 21 Drawing Sheets

(51) Int. Cl.
*H01L 29/16* (2006.01)
*H01L 27/092* (2006.01)

(58) Field of Classification Search
CPC ............... H01L 29/785; H01L 29/7853; H01L 29/78648; H01L 29/78642; H01L 29/78686; H01L 29/7869; H01L 27/092; H01L 27/0922; H01L 21/8258
See application file for complete search history.

(56) References Cited

U.S. PATENT DOCUMENTS

| | | | |
|---|---|---|---|
| 6,392,917 B1 | 5/2002 | Kang | |
| 6,404,667 B1 | 6/2002 | Yoo | |
| 6,700,133 B1 | 3/2004 | Ohtani et al. | |
| 6,873,029 B2 | 3/2005 | He et al. | |
| 7,919,800 B2 | 4/2011 | Gonzalez et al. | |
| 8,258,498 B2 | 9/2012 | Majhi et al. | |
| 8,395,191 B2 | 3/2013 | Or-Bach et al. | |
| 9,263,527 B2 | 2/2016 | Yamada et al. | |
| 9,576,960 B2 | 2/2017 | Khakifirooz et al. | |
| 9,673,285 B2 | 6/2017 | Simin et al. | |
| 9,705,003 B2 | 7/2017 | Yamazaki et al. | |
| 9,991,268 B1 | 6/2018 | Liaw | |
| 10,026,845 B2 | 7/2018 | Pillarisetty et al. | |
| 10,084,058 B2 | 9/2018 | Majhi et al. | |
| 10,224,279 B2* | 3/2019 | Or-Bach | H01L 45/1226 |
| 10,312,289 B1* | 6/2019 | Ota | H01L 45/085 |
| 11,171,243 B2 | 11/2021 | Dewey et al. | |
| 11,282,963 B2* | 3/2022 | Ahmed | H01L 29/7869 |
| 11,355,505 B2 | 6/2022 | Morris et al. | |
| 2003/0132470 A1 | 7/2003 | Joshi et al. | |
| 2005/0236622 A1 | 10/2005 | Jung et al. | |
| 2007/0155067 A1 | 7/2007 | Park et al. | |
| 2009/0146141 A1* | 6/2009 | Song | H01L 29/78681 438/102 |
| 2010/0038743 A1 | 2/2010 | Lee | |
| 2010/0110758 A1 | 5/2010 | Li et al. | |
| 2010/0224873 A1 | 9/2010 | Sakata et al. | |
| 2011/0121266 A1 | 5/2011 | Majhi et al. | |
| 2011/0168993 A1 | 7/2011 | Jeon et al. | |
| 2012/0003808 A1 | 1/2012 | Lee | |
| 2012/0319728 A1 | 12/2012 | Madurawe | |
| 2013/0264620 A1 | 10/2013 | Yu et al. | |
| 2013/0292702 A1 | 11/2013 | Horii | |
| 2014/0009998 A1 | 1/2014 | Schloss et al. | |
| 2014/0145272 A1 | 5/2014 | Or-Bach et al. | |
| 2014/0183637 A1 | 7/2014 | Cohen et al. | |
| 2015/0171167 A1* | 6/2015 | Nourbakhsh | H01L 29/78648 257/29 |
| 2015/0179786 A1* | 6/2015 | Kim | H01L 29/785 438/283 |
| 2015/0249096 A1 | 9/2015 | Lupino et al. | |
| 2015/0255139 A1 | 9/2015 | Atsumi et al. | |
| 2015/0364565 A1 | 12/2015 | Ramaswamy et al. | |
| 2016/0043114 A1 | 2/2016 | Mao | |
| 2016/0056039 A1 | 2/2016 | Kim et al. | |
| 2016/0056249 A1 | 2/2016 | Kleemeier et al. | |
| 2016/0204277 A1 | 7/2016 | Yang et al. | |
| 2016/0225915 A1 | 8/2016 | Qiu et al. | |
| 2016/0359062 A1* | 12/2016 | Heo | H01L 31/032 |
| 2016/0365372 A1 | 12/2016 | Li et al. | |
| 2017/0133375 A1 | 5/2017 | Fung | |
| 2017/0162702 A1 | 6/2017 | Hu | |
| 2017/0200744 A1 | 7/2017 | Giles et al. | |
| 2017/0358598 A1 | 12/2017 | Bedeschi | |
| 2018/0130785 A1 | 5/2018 | Wang et al. | |
| 2018/0226248 A1 | 8/2018 | Jahangir et al. | |
| 2018/0226509 A1 | 8/2018 | Karpov et al. | |
| 2019/0027535 A1 | 1/2019 | Kumar et al. | |
| 2019/0267319 A1 | 8/2019 | Sharma et al. | |
| 2019/0287858 A1 | 9/2019 | Dasgupta et al. | |
| 2019/0371892 A1* | 12/2019 | Lee | H01L 29/778 |
| 2020/0098564 A1 | 3/2020 | Li et al. | |
| 2020/0135921 A1 | 4/2020 | Chiang | |
| 2020/0258884 A1 | 8/2020 | Rachmady et al. | |
| 2020/0350440 A1* | 11/2020 | Gao | G11C 13/003 |
| 2020/0357814 A1 | 11/2020 | Kim et al. | |
| 2022/0052200 A1 | 2/2022 | Dewey et al. | |

OTHER PUBLICATIONS

Zubko, P., et al., "Ferroelectric Domains in PbTiO3/SrTiO3 Superlattices", Ferroelectrics, vol. 433, No. 1, Sep. 12, 2012, pp. 127-137.

* cited by examiner

TRANSISTORS WITH METAL CHALCOGENIDE CHANNEL MATERIALS

BACKGROUND

Demand for integrated circuits (ICs) in portable electronic applications has motivated greater levels of semiconductor device integration. Many advanced semiconductor devices in development leverage non-silicon semiconductor materials. One class of those materials is transition metal dichalcogenides (TMD or TMDC). Similar to graphene, TMDCs display semiconductor properties as a unit cell of $MX_2$, where M is a transition metal atom (e.g., Mo, W) and X is a chalcogen atom (S, Se, or Te). TMDC materials have been of significant interest in highly-scaled integrated circuitry (IC), in part because of the thin active layers possible. A TMDC-channeled transistor may therefore have excellent short channel properties. It has also been shown that many TMDC materials have good electron and hole mobility, making them interesting for complementary short channel devices (e.g., $L_g$<20 nm).

However, most TMDC materials have thus far been obtained through transfer techniques employing exfoliation (e.g., scotch tape liftoff) that will not likely be suitable for high volume device manufacturing. TMDC materials have also proven to be relatively unstable, for example tending to decompose when heated above 250° C. Since many IC fabrication processes employ temperatures of 300-400° C., or higher, the instability of the material poses a significant barrier to the integration of TMDC into ICs.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
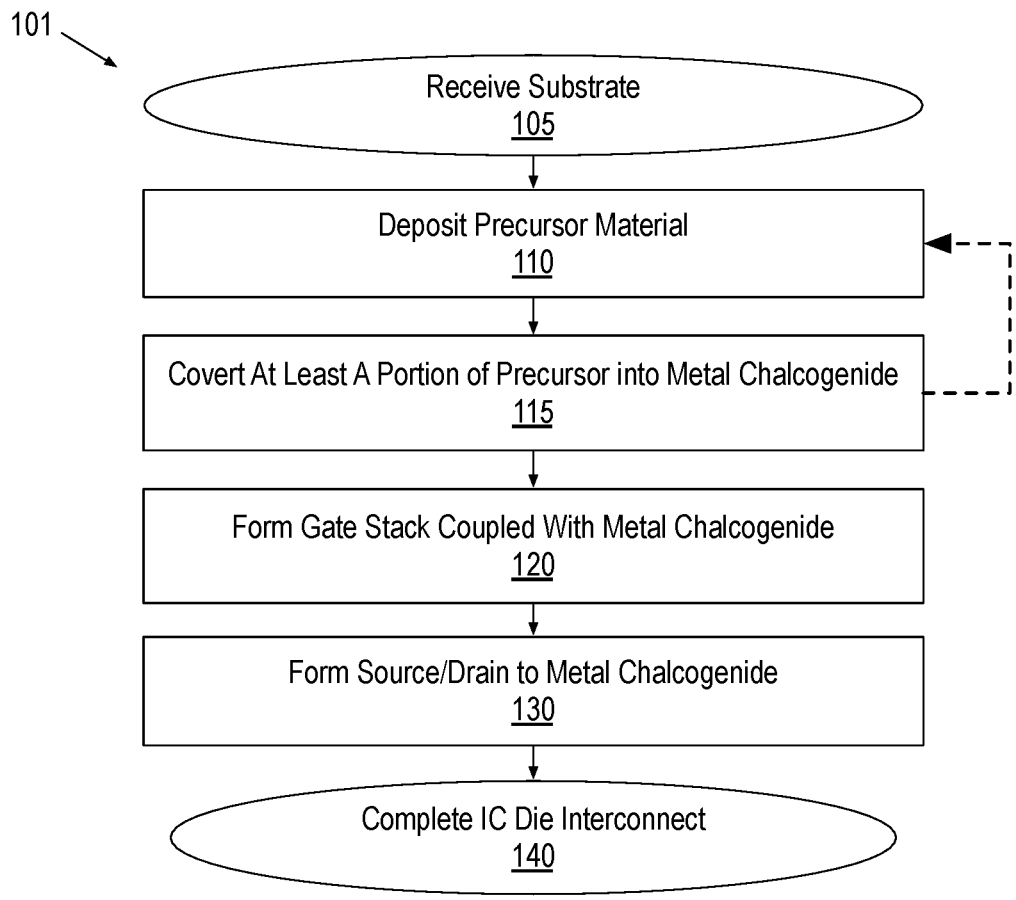
FIG. 1 is a flow diagram illustrating methods of fabricating transistor structures, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are transistor structures employing metal chalcogenide channel materials, and methods of fabricating such structures. FIG. 1 is a flow diagram illustrating fabrication methods 101, in accordance with some exemplary embodiments. Methods 101 begin at block 105 where a substrate is received. The substrate may advantageously include a monocrystalline semiconductor layer, such as a silicon layer, upon which front-end-of-line (FEOL) FETs may be fabricated, for example upstream of methods 101. In some embodiments, the substrate received may include FEOL FETs of any architecture that have been fabricated using any technique, and that are interconnected with one or more metallization levels to form FEOL circuitry. In some examples, the FEOL FETs include both n-type and p-type FETs interconnected into a CMOS FEOL circuit.

At block 110 a precursor material is deposited over the substrate, for example as a thin film, using any thin film deposition technique suitable for a desired material composition. In some embodiments, a metallic precursor material is deposited at block 110. Physical vapor deposition (PVD), molecular beam deposition (MBD) or metal-organic chemical vapor deposition (MOCVD) techniques may be employed, for example, to deposit a thin film of substantially pure elemental metal or metal alloy. The precursor material may be deposited to film thicknesses controlled to tens or hundreds of monolayers, for example. In some embodiments, the metallic precursor material is deposited to a thickness of 5-15 nm.

The metallic precursor deposited at block 110 may include one or more d-block or p-block elements. Suitable d-block transition metals include Old IUPAC Groups IIIA-IIB/New IUPAC Groups 3-12. Suitable p-block elements include the metal side of Old IUPAC Groups IIIB/New IUPAC Group 13 through Old IUPAC Group VIB/New IUPAC Group 16). A precursor material deposited at block 110 may also include the metalloids (e.g., As) and non-metals (e.g., P) of the p-block elements as constituents of an alloy that further comprises a d-block and/or p-block metal. In metal alloy embodiments, the metallic precursor material includes significant amounts of two or more such metals (e.g., in the form of a binary alloy or ternary alloy). The alloys may be any linear combination of the constituents. For example, a binary alloy $M1_yM2_{1-y}$ may include any atomic percent of a first metal (M1) and a complementary atomic percent of a second metal (M2), or metalloid/non-metal. A ternary alloy $M1_yM2_zM3_{1-y-z}$ may include any atomic percent of metal M1, any atomic percent of metal M2, and a complementary atomic percent of a third metal (M3), or metalloid/non-metal such that y and z are both greater than 0, but sum to less than 1. One exemplary alloy mixture is approximately equal parts of M1, M2 and M3 (1:1:1).

In some other embodiments, the precursor material deposited at block 110 is a metal oxide. For such embodiments, CVD techniques such as atomic layer deposition (ALD) may be employed. Metal oxide precursor materials may have a thin film thickness somewhat more tightly controlled than for metallic embodiments that are not self-limited to integer monolayers. Metal oxide precursor film thickness may therefore range from as little as 2-3 monolayers of metal oxide to more than 10 nm. The metal oxide deposited at block 110 may be a suboxide ($A_2O$) monoxide (AO), binary oxide ($AO_2$), ternary oxide ($ABO_3$), or mixture thereof (e.g., where a linear mixture variable x may range between 1 and 2). The metal oxide may include one or more of the d-block or p-block metal(s) listed above, and may include an alloy of the metals and/or p-block metalloids or nonmetals. The metal oxide may be a semiconductor or a dielectric material depending on composition.

Methods 101 continue at block 115 where at least a portion of the precursor material deposited at block 110 is converted into a semiconducting metal chalcogenide. The metal chalcogenide may be formed, for example, where a chalcogen is introduced into at least a portion of the previously deposited precursor material that comprises suitably reactive metal(s). As used herein, chalcogens include at least one of sulfur, selenium or tellurium (oxygen is excluded), with the inventors having found S or Se to be particularly advantageous. In some exemplary embodiments, block 115 entails a thermal process performed in the presence of S, Se or Te. In some examples, the precursor material is heated to over 200° C. (e.g., 250-1000° C.) in the presence the reactive species for a predetermined time. The reactive species may be delivered as a gas of various compositions, with some examples including $H_2S$, $H_2Se$, $H_2Te$. As these examples can also act as strong reducing agents, they may be combined or replaced with weaker reducing agents/stronger oxidizing agents. For example, in some embodiments $SO_2$ or $SeO_2$ is introduced in combination with, or to the exclusion of, $H_2S$ or $H_2Se$, respectively. Other gases, such as, $NH_3$, $SF_6$, $N_2$, Ar, $N_2O$ may also be introduced in combination with one or more of $H_2S$ and $SO_2$, $H_2Se$ and $SeO_2$, or $H_2Te$ with gases lacking oxygen tempering the reducing strength somewhat less than those that introduce oxygen.

Conversion into a chalcogenide may occur in a manner than renders a polycrystalline metal chalcogenide having no significant crystal texture. In some embodiments, however, microstructural order may be improved by seeding the formation of chalcogenides from a metallic or metal oxide precursor. For example, block 115 may further include forming a seed structure over a precursor material. The seed structure may be a patterned feature of any material that will preferentially form a chalcogenide more rapidly than the precursor material. Hence, in such embodiments, a seed material may be deposited over the precursor material, and that seed material then patterned, for example with a masked etch to re-expose a surface of the precursor material. Conversion of the seed structure into a metal chalcogenide has been found to initiate the subsequent conversion of the precursor material at the interface of the seed structure with a conversion front then propagating away from the seed structure. The addition of seed structures may reduce the spontaneity of the conversion reaction such that greater crystallization of the metal chalcogenide can occur. For metal oxide precursor materials, the seed structure may be a variety of metals as most d-block or p-block metals will form metal chalcogenides more rapidly than will an oxide of d-block or p-block metal(s). For metallic precursor materials, the seed structure composition may be more limited, for example to only those metals that will form a chalcogenide more rapidly than the precursor metal or metal alloy does spontaneously.

Metal chalcogenides in accordance with embodiments herein, that may be formed at block 115 for example, are semiconductors having either p-type or n-type conductivity. The metal chalcogenide channel materials described herein are well suited to implementing complementary transistor logic (CMOS) within BEOL circuitry, for example. The metal chalcogenide may be a dichalcogenide ($MC_2$). However, it need not be a dichalcogenide because a number of oxidation states are possible such that the resulting compound is better characterized as $MC_x$. In some advantageous embodiments, x is between 0.2 and 4. For some embodiments with a metallic precursor, one or more d-block or p-block metals is converted into the metal chalcogenide, $MS_x$, $MSe_x$, or $MTe_x$. For example, a metal M1 (e.g., Cu, Zn, Zr, Re, Hf, Ir, Ru, Cd, Ni, Co, Pd, Pt, Ti, Cr, V, W Mo, Al, Sn, Ga, In, B, Ge, Si, P, As, or Sb) may be reacted with S, Se or Te to generate $M1S_x$, $M1Se_x$, or $M1Te_x$, respectively. Each of these may comprise predominantly the metal M1 and the chalcogenide. For example, any of $CuS_x$, $CuSe_x$, $CuTe_x$, $ZnS_x$, $ZnSe_x$, $ZnTe_x$ $ZrS_x$, $ZrSe_x$, $ZrTe_x$, $ReS_x$, $ReSe_x$, $TeSe_x$ $RuS_x$, $RuSe_x$, $RuTe_x$$IrS_x$, $IrSe_x$, $IrTe_x$, $CdS_x$, $CdSe_x$, $CdTe_x$ $NiS_x$, $NiSe_x$, $NiTe_x$ $CoS_x$, $CoSe_x$, $CoTe_x$ $PdS_x$, $PdSe_x$, $PtSe_x$ $PtS_x$, $PtSe_x$, $PtTe_x$ $TiS_x$, $TiSe_x$, $TiTe_x$ $CrS_x$, $CrSe_x$, $CrTe_x$$VS_x$, $VSe_x$, $VTe_x$, $WS_x$, $WSe_x$, $WTe_x$$MoS_x$, $MoSe_x$, $MoTe_x$, $AlS_x$, $AlSe_x$, $AlTe_x$ $SnS_x$, $SnSe_x$, $SnTe_x$, $GaS_x$, $GaSe_x$, $GaTe_x$ $InS_x$, $InSe_x$, $InTe_x$ $SbS_x$, $SbSe_x$, $SbTe_x$ $GeS_x$, $GeSe_x$, $GeTe_x$ $SiS_x$, $SiSe_x$, or $SiTe_x$ may be formed at block 115 as a function of the metal or metal alloy deposited at block 110. Similarly, M1M2 or M1M2M3 alloys may be reacted with one or more of S, Se, or Te. For example, a linear combination of InGaZn deposited at block 110 may be converted into $InGaZnSe_x$ at block 115. Alloys including metalloids or non-metals from the p-block may also be reacted with S, Se, or Te. For example, InZnP deposited at block 110 may be converted into $InZnPSe_x$ at block 115.

In embodiments where the precursor is an oxide of one or more metals (M1, M1M2, M1M2M3, etc.), at least a portion of the metal oxide is converted to a semiconducting metal chalcogenide at block 115. Sulfur or selenium may replace oxygen in the compound to generate a semiconducting metal chalcogenide. For example, $InO_x$, $GaO_x$, $ZnO_x$, or IGZO deposited at block 110 may be reacted with one or more of S, Se or Te at block 115, for example to generate $InS_x$ or $InSe_x$, $GaS_x$ or $GaSe_x$, $ZnS_x$ or $ZnSe_x$, $IGZS_x$ or $IGZSe_x$. In some embodiments, both sulfur and selenium may replace oxygen in the compound to generate a semiconducting metal chalcogenide (e.g., $M_1S_xSe_{1-x}$, $M_1M_2S_ySe_{1-x}$, etc.). In other embodiments, any combination of sulfur, selenium and tellurium may replace oxygen in the compound to generate a semiconducting metal chalcogenide.

Notably, the metal chalcogenide formed at block 115 may be more thermally stable than many alternative semiconductor materials, particularly those deposited as thin films. For example, the inventors have found some oxide semiconductors, such as $ZnO_x$ and IGZO, decompose at elevated temperatures (e.g., above 250° C.-300° C.). As a result, semiconducting properties of such materials may be lost during subsequent IC fabrication processes. However, converting such materials into a chalcogenide renders a semiconductor that it sufficiently stable to survive temperatures in excess of 400° C. (e.g., 500° C.-800° C.).

The inventors have found that among semiconducting d-block metal chalcogenides, those with Group IIB/Group 12 metals (Zn Group) appear to be significantly more stable than those with other d-block metals. Hence, in embodiments where a d-block chalcogenide is formed, the subset including Zn Group metals may be particularly advantageous at least for their stability. Although not bound by theory, the improved thermal stability of Zn Group chalcogenides may be attributable to their completely filled d-orbital. With s-orbital electrons playing a more significant role, the properties of semiconducting Zn Group chalcogenides may be more akin to p-block metal chalcogenides than to the other d-block metal chalcogenides, at least with respect to stability of the material.

The inventors have also found that metal chalcogenides including p-block elements may offer advantages, at least with respect to thermal stability. Hence, while (exclusively) d-block metal chalcogenides may be formed at block 115, the inventors have found the formation of p-block metal chalcogenides to be advantageous for at least their stability. Therefore, embodiments where the precursor material deposited at block 110 includes a p-block metal (either in combination with, or to the exclusion of, a d-block metal) may be advantageous over embodiments where the precursor material includes exclusively d-block metal(s). Although not bound by theory, it is noted that the improved thermal stability of p-block metal chalcogenides may be attributable to differences in binding energies of d and p orbital electrons, and/or different extents by which s-orbital electrons participate in chemical bonding and electron transport phenomena. For example, the greater ionic character of p-block constituents may increase s-orbital participation for the p-block relative to the d-block. Hence, although $ZnS_x$ or $ZnSe_x$ may be formed at block 115 in some embodiments, the addition of one or more p-block metals, such as indium and/or gallium, may result in a semiconducting chalcogenide of greater stability. The inventors have found, for example, that the conversion of indium-gallium-zinc (IGZ), or an oxide thereof (IGZO), into semiconducting indium-gallium-zinc sulfide ($IGZS_x$) or indium-gallium-zinc selenide ($IGZSe_x$) displays stability superior to $ZnS_x$ or $ZnSe_x$. The stability of $IGZSe_x$ (e.g. with I:G:Z of 1:1:1) may also be superior to either $InSe_x$ or $GaSe_x$. As such, alloyed embodiments including one or more p-block elements may be particularly advantageous.

While the metal chalcogenides in accordance with embodiments herein may be of predominantly the constituents described above, they can also comprise dopants (e.g., in concentrations up to 1e21 atoms/cm3). Exemplary dopants include N, O, H, F, Cl, Si, Ge, or any additional metals.

The conversion process practiced at block 115 may be self-limiting so that in some embodiments not all of the precursor material is converted at block 115. For example, formation of chalcogenide on a surface of the precursor material, or to some skin depth, may retard further formation of chalcogenide below the surface/skin depth. A resulting transistor structure may then retain some remnant precursor material. For example, a metal oxide precursor material may be retained as a portion of a transistor channel if the metal oxide precursor material is also semiconductor. Alternatively, a metal oxide precursor material may be retained as a gate dielectric or isolation dielectric if the metal oxide precursor material is a dielectric. Metallic precursor material might also be retained in a transistor structure where doing so does not create a short across transistor terminals. For example, metallic precursor material might be retained as the metal part of a metal-semiconductor (Schottky junction) to a semiconducting metal chalcogenide. Such a Schottky junction may be operable as a gate junction (e.g., in a MESFET architecture), or as a back bias junction (e.g., in a four terminal FET architecture), for example. Such a Schottky junction may also be suitable for a tunnel source or drain terminal contact, for example.

In some embodiments, multiple layers of precursor material are iteratively deposited and converted to form a material stack that includes multiple semiconductor material layers. As shown in FIG. 1 by the dashed arrow, block 110 may be repeated after block 115 for each iteration. With the metal chalcogenide formed at each iteration having good stability, subsequent iterations may be practiced without detriment to the material formed in prior iterations, to generate device structures with any number of semiconductor material layers.

In some embodiments, two successive iterations of blocks 110 and 115 are practiced to form two semiconducting metal chalcogenide material layers. In some of these embodiments, the two metal chalcogenides have different compositions. For example, a first of the metal chalcogenides may include a metal M1 (or alloy thereof) while a second of the metal chalcogenides may include a metal M2 (or alloy thereof). As another example, a first of the metal chalcogenides may include metal M1 and S (e.g., $M1S_x$), while a second of the metal chalcogenides may include metal M1 and Se (e.g., $M1Se_x$). As another example, a first of the metal chalcogenides may include metal M1 and S (e.g., $M1S_x$), while a second of the metal chalcogenides may include metal M2 and Se (e.g., $M2Se_x$). With different compositions, band gap can be engineered between two semiconducting metal chalcogenide materials. Conductivity type may also be varied. For example, a first of the metal chalcogenides may be p-type while a second of the metal chalcogenides may be n-type. Accordingly, and as described further below, complementary logic may be implemented with a single three terminal device that includes two different semiconducting metal chalcogenide materials of complementary type, or that includes a semiconducting metal chalcogenide of a first conductivity type (e.g., p-type) and a semiconducting oxide of a second conductivity type (e.g. n-type).

In some further embodiments, three or more successive iterations of blocks 110 and 115 are practiced to form structures with three or more semiconducting metal chalcogenide material layers. In some of these embodiments, the metal chalcogenides have at least two different compositions. Multiple-quantum-well (MQW) structures may therefore be fabricated by inserting a first metal chalcogenide of a first composition between two other metal chalcogenides of a second composition. As such, a number of devices other than field effect transistors may be fabricated with metal chalcogenide materials having one or more of the attributes described herein. For example, three or more semiconducting metal chalcogenide material layers may be employed in a bipolar transistor (e.g., NPN) structure.

With one or more semiconducting metal chalcogenide materials on a substrate, device terminals may be formed and those terminals interconnected into circuitry. As further shown in FIG. 1, methods 101 proceed with the fabrication of terminals of a transistor that employ at least one metal chalcogenide as a transistor channel. In the specific FET example illustrated in FIG. 1, at block 120 a gate stack including a gate dielectric and a gate electrode is formed to be coupled to a first portion of the metal chalcogenide. Any gate dielectric may be fabricated at block 120. Any gate electrode material may be further fabricated so as to be capacitively coupled to the metal chalcogenide through the gate dielectric. At block 120 a gate stack may be formed over, under, or adjacent to a sidewall of a metal chalcogenide. At block 130, a source and a drain are fabricated so as to be electrically coupled to second and third portions of the metal chalcogenide that are separated by the first portion of the metal chalcogenide controllable through the gate stack. Terminal fabrication at blocks 120 and 130 may be according to a variety of three-terminal architectures, some of which are further illustrated below. Methods 101 end at block 140 with IC die interconnection, for example to couple terminals of multiple transistors into circuitry. In some such embodiments, at block 140 BEOL metal chalcogenide transistor circuitry is electrically interconnected to FEOL Group IV (e.g., Si or SiGe) circuitry through one or more metallization levels.

Notably, for transistor structures fabricated according to methods 101, the metal chalcogenide channel material is advantageously derived through a post-deposition chemical conversion or treatment of a thin film precursor. This is in contrast to an exfoliation technique where a metal chalcogenide channel material is physically transferred onto a host substrate. Although an exfoliation technique might be employed as an alternate means to fabricate one or more of the metal chalcogenide channel materials described herein, the conversion process introduced in FIG. 1 is well suited to high volume manufacturing.

Conversion of a precursor thin film material is also in contrast to deposition of thin film material that is semiconducting substantially as-deposited, and/or following some non-reactive thermal anneal of a deposited thin film material. One salient feature of post-deposition conversion in accordance with methods 101 is that the metal chalcogenide channel material in accordance with embodiments herein may have a thickness of only 2-3 monolayers. This thickness regime may be significantly below a thickness control threshold associated with deposition processes suitable for directly depositing a semiconducting thin film. Hence, whereas TFT channel material thicknesses may be practically limited by the deposition process to material thicknesses that are over 10 nm, methods 101 may yield various metal chalcogenide channel materials in a lower thickness regime, for example one that advantageously ranges from 0.3 nm to 10 nm. Relative to a TFT thickness regime, this lower thickness regime may translate into superior control of a transistor channel as a function of an applied gate electrode voltage because the transistor channel is substantially two dimensional (2D).

The precursor conversion process illustrated by methods 101 may be implemented in a variety of manners. In some embodiments, the various blocks illustrated in FIG. 1 may be ordered differently than illustrated, for example with the gate stack and or source/drain formation blocks performed prior to conversion of the precursor material.

Figure 2:
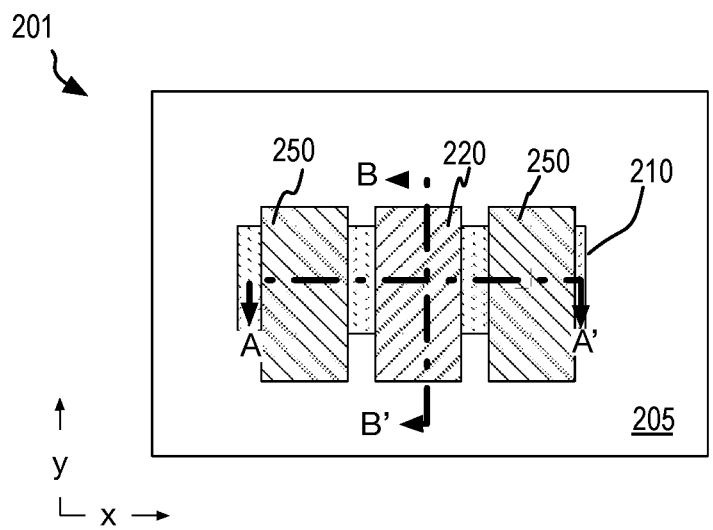
FIG. 2 is a plan view of a transistor structure including a metal chalcogenide channel material, in accordance with some embodiments.

FIG. 2 is a plan view of a transistor structure 201 including a metal chalcogenide channel material, in accordance with some embodiments. In FIG. 2, heavy dot-dashed lines denote planes A-A' and B-B' along which cross-sectional views are further provided for various embodiments further described below. Transistor structure 201 may be arrayed over an area of a device layer within IC die, for example. Transistor structure 201 is a FET with a source terminal, a drain terminal, and a gate terminal, in accordance with some illustrative embodiments. These terminals are at least in part electrically coupled through one or more semiconducting metal chalcogenides having one or more of the attributes described above in the context of methods 101. Transistor structure 201 may be a planar FET, or a non-planar FET. Non-planar examples include a FinFET, Tri-Gate, and omega-gate. Whether planar or non-planar, the channels may be laterally oriented (e.g., transistor structure 201) or vertically oriented, for example as described further below.

In FIG. 2, transistor structure 201 is over a substrate with a semiconductor body 210 extending over an area of a substrate 205. Although only one semiconductor body 210 is illustrated in FIG. 2, a FET may include one or more such semiconductor bodies. Semiconductor body 210 comprises a metal chalcogenide having one or more of the attributes described above. In some embodiments, semiconductor body 210 is monocrystalline, having some major and/or minor axes orientation(s) within the x-y plane of an underlying substrate. In other embodiments, semiconductor body 210 is polycrystalline, which may advantageously have texture that may also be characterized by some major and/or minor axes orientation(s) within the x-y plane. In some polycrystalline embodiments, semiconductor body 210 lacks any discernable texture.

A gate electrode 220 overlaps, underlaps, or otherwise intersects a channel region of semiconductor body 210. Gate electrode 220 may include an elemental metal layer, a metal alloy layer, or laminate structure of either or both. In some embodiments the gate electrode is a metal nitride, such as TiN. The gate electrode may also comprise Al (e.g., TiAlN). Other alloy constituents may also be employed in gate electrode 220, such as, but not limited to C, Ta, W, Pt, and Sn.

With a lateral channel layout, source/drain metallization 250 is adjacent to gate electrode 220 and also intersects ends of semiconductor body 210 that are on opposite sides of gate electrode 220. Source/drain metallization 250 may be in direct contact with semiconductor body 210 (e.g., in direct contact with a metal chalcogenide). Alternatively, there may be an intervening source/drain semiconductor (not depicted), which is further in contact with the metal chalcogenide employed as the transistor channel. Noting body 210 may comprise only a few monolayers of semiconducting metal chalcogenide, contact resistance may pose a significant challenge as high source/drain contact resistances can degrade on-current and/or other operating characteristics of transistor. Source/drain metallization 250 may therefore include one or more metals that form an ohmic or tunneling junction directly to semiconductor body 210 or to an intervening source/drain semiconductor material. Source/drain metallization 250 may comprise any metal. Examples include Ti, W, Pt, their alloys, and nitrides. Source/drain semiconductor material, if present, need not also be a metal chalcogenide, but can be. If not also a metal chalcogenide, source/drain semiconductor may be any semiconductor material compatible with the metal chalcogenide channel material, such as, but not limited to, group IV semiconductors (e.g., Si, Ge, SiGe), and/or group III-V semiconductors (e.g., InGaAs, InAs), and/or group III-N semiconductors (e.g., InGaN), group II-VI semiconductors, or metal oxide semiconductors.

The plan view of transistor structure 201 is applicable to a number of transistor architectures, some of which are further described in the context of FIG. 3-18. For the sake of clarity, reference numbers are repeated for features that may share the same attributes (e.g., composition).

Figure 3:
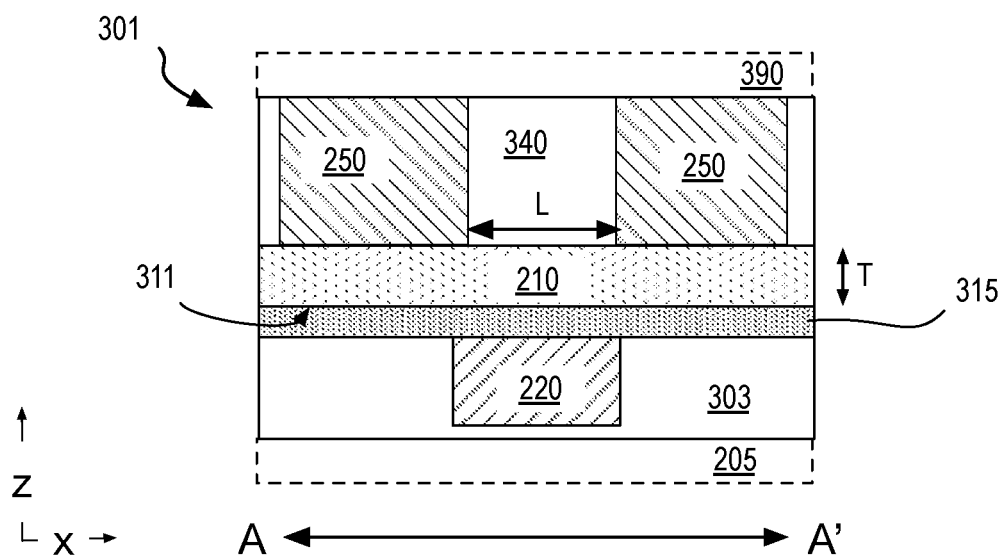
FIGS. 3, 4, 5, 6, 7, 8, 9, 10, 11, and 12 are cross sectional views of transistor structures including a metal chalcogenide channel material along the A-A' line introduced in FIG. 2, in accordance with some embodiments.

In FIG. 3, transistor structure 301 comprises gate electrode 220 on a bottom side of semiconductor body 210, and source/drain contact metallization 250 on a top side of semiconductor body 210. Gate electrode 220 is embedded within a dielectric material 303, which may be any suitable material such as, but not limited to, silicon dioxide, silicon nitride, or silicon oxynitride, a low-k material having a relative permittivity below 3.5, for example, or a dielectric metal oxide. Dielectric material 303 is over substrate 205, which is illustrated in dashed line to emphasize that substrate 205 may include any number of FEOL material and/or circuitry levels. Similarly, source/drain contact metallization 250 is embedded within a dielectric material 340, which may be any suitable material (e.g., silicon dioxide, silicon nitride, or silicon oxynitride, or a low-k material). Any number of BEOL material and/or circuitry levels 390 may be over dielectric material 340.

In the "bottom-gate" architecture illustrated in FIG. 3, transistor channel length L is dependent on the spacing of source/drain contact metallization 250, which may be defined by some minimum lithographic feature resolution (e.g., 10-20 nm pitch). As noted above, metal chalcogenides, particularly those formed according to methods 101, may have thicknesses of only a few monolayers. Channel thickness T may therefore be as little as 0.5-10 nm. In some exemplary embodiments therefore, channel length L is larger than channel thickness T. Length L is independent of gate length (e.g., x-dimension) in this bottom gate architecture, so channel gate electrode 220 may extend under source/drain metallizations 250 by an arbitrary amount, and may even be present over the entire area under semiconductor body 210.

FIG. 3 further illustrates gate dielectric 315 between semiconductor body 210 and gate electrode 220. Gate dielectric 315 may be any material(s) suitable for the compositions of semiconductor body 210 and gate electrode 200. Together, gate electrode 220 and gate dielectric 315 are referred to as a gate stack. While any gate stack materials known to be suitable for a metal chalcogenide channel may be utilized, in some exemplary embodiments the gate stack includes a high-k dielectric material (with a bulk relative permittivity greater than 9), and a metal gate electrode having a work function suitable for semiconductor body 210. Exemplary high-k materials include metal oxides, such as, but not limited to $GaO_x$, $AlO_x$ (comprising predominantly Al and O), $HfO_x$ (comprising predominantly Hf and O) $HfAlO_x$ (comprising predominantly Al, Hf, and O). These exemplary metal oxides may form a stable interface to a chalcogenide channel material. Silicates, such as, but not limited to $HfSiO_x$, or $TaSiO_x$ may also be suitable. Although a MOSFET architecture is shown in FIG. 3, a bottom gate may be similarly employed in a MESFET structure where gate dielectric 315 is absent, and gate electrode 220 is instead in direct contact with semiconductor body 210.

Transistor structure 301 may be fabricated according to a variety of techniques. Methods 101 may be employed for example, where a precursor material is deposited over dielectric material 303, and then converted into a metal chalcogenide to form semiconductor body 210. Source/drain metallization 250 may then be deposited over the metal chalcogenide. Where conversion of the precursor material is complete, the precursor material may be deposited over gate electrode 220, and over gate dielectric 315, to arrive at transistor structure 301. However, as noted above in the context of methods 101, conversion of a precursor material may be incomplete, for example where only a partial thickness of precursor material is converted. Hence in transistor structure 301, semiconductor body 210 may have a channel thickness T that is significantly less than a thickness of an as-deposited precursor material. In some embodiments, only a top portion of a metallic precursor is converted into semiconductor body 210. An unreacted portion of the precursor may be on a semiconductor bottom side 311, for example. Remnant precursor material may then be separated from gate electrode 220 by gate dielectric 315. Where the remnant precursor material is metallic, for example, it may be operable as a floating gate. Where gate dielectric 315 is absent, remnant metallic precursor material may be incorporated into gate electrode 220, for example, in a MESFET architecture where gate electrode 220 is in direct contact with semiconductor body 210. The presence of the same metal(s) within both gate electrode 220 and the semiconducting chalcogenide would indicate semiconductor body 210 has been derived from a portion of gate electrode 220, for example according to methods 101.

In some other embodiments where only a top portion of a metal oxide precursor is converted into semiconductor body 210, unreacted portions of the metal oxide precursor may similarly be on the semiconductor bottom side 311. Remnant metal oxide precursor material, if a dielectric, may be operable as gate dielectric 315, for example. For such embodiments, the presence of the same metal(s) within both gate dielectric 315 and semiconductor body 210 would indicate semiconductor body 210 has been derived from a portion of gate dielectric 315. As one example, for a semiconductor body 210 comprises $GaS_x$ or $GaSe_x$ and gate dielectric 315 comprises $GaO_x$, the presence of Ga in both of materials suggests semiconductor body 210 was derived from a portion of gate dielectric 315, for example according to methods 101. $WO_x$ is another example of a metal oxide with sufficient band gap to be operable as a gate dielectric, in which case semiconductor derived from that material might be $WS_x$ or $WSe_x$.

Figure 4:
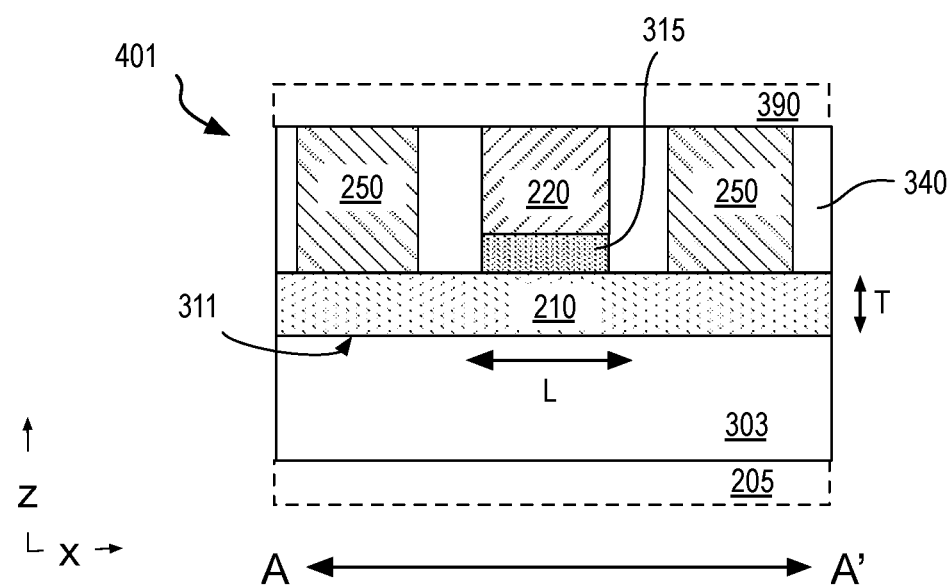

FIG. 4 illustrates an exemplary transistor structure 401 that includes a top-side gate electrode 220 along with top-side source/drain contact metallization 250. In this MOSFET architecture, gate dielectric 315 is again between gate electrode 220 and semiconductor body 210. However, transistor channel length L is dependent on physical dimensions of gate electrode 220 and also a lateral spacing between electrode 220 and source/drain contact metallization 250. In transistor structure 401, channel thickness T may therefore also be significantly smaller than channel length L.

Transistor structure 401 may again be fabricated according to a variety of techniques. However, methods 101 may be advantageously employed to convert a previously deposited precursor material into a metal chalcogenide to form semiconductor body 210. Source/drain metallization 250, gate dielectric 315 and gate electrode 220 may then all be deposited over the metal chalcogenide according to any known techniques. Transistor structure 401 may be fabricated by depositing the precursor material over dielectric material 303. Where conversion of a precursor material is incomplete, some remnant precursor material may be present on semiconductor bottom side 311. For example, where dielectric material 303 is the precursor material (e.g., a metal oxide), semiconductor body 210 may be a top portion of that metal oxide that has been converted, while the remnant metal oxide provides electrical isolation if it is a good dielectric. If remnant metal oxide is instead a stable semiconductor, a multi-channel architecture may result, for example as described elsewhere herein.

In alternative embodiments where dielectric material 303 is not precursor material, an unconverted remnant of the precursor material on semiconductor bottom side 311 may be between located between dielectric material 303 and semiconductor body 210. Although not depicted in FIG. 4, a metallic precursor material may be present on semiconductor bottom side 311. The presence of such a precursor material may not significantly hinder transistor operation assuming there is no electrical shorting of source/drain metallization 250.

Figure 5:
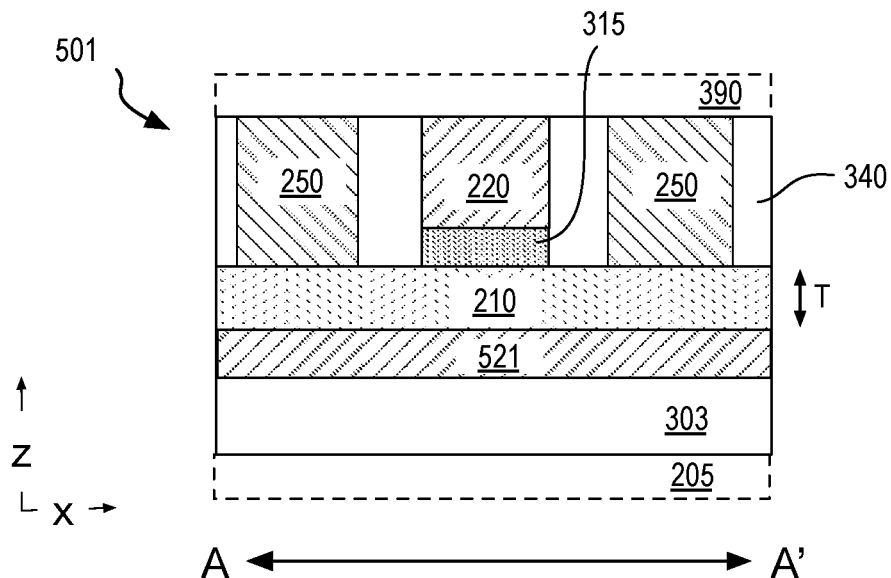

FIG. 5 illustrates a cross-sectional view of a four terminal transistor structure 501, in accordance with some embodiments. In transistor structure 501, a bias gate 521 is added to the top-side three terminal transistor structure 401 (FIG. 4). Bias gate 521 is in contact with a bottom side of semiconductor body 210, opposite gate electrode 220. In this example, bias gate 521 may set a body potential for semiconductor body 210 independent of any gate potential applied to gate electrode 220. Bias gate 521 forms a metal-semiconductor junction with a bottom surface of semiconductor body 210. Bias gate 521 may therefore have any metal composition having a suitable bandgap offset with semiconductor body. Semiconductor body 210 may have been derived from bias gate 521, for example through a conversion process in accordance with methods 101. For such embodiments, both bias gate 521 and semiconductor body 210 would include the same metal(s). In alternative embodiments, for example where bias gate 521 comprises metal(s) other than those of semiconductor body 210, a precursor of semiconductor body 210 may be directly deposited over bias gate 521, and then the precursor converted to a suitable metal chalcogenide (e.g., any of those described above).

The four-terminal architecture of transistor structure 501 may also be modified so as to add a gate dielectric (not depicted) between bias gate 521 and semiconductor body 210. Bias gate 521 may then be electrically tied to gate electrode 220 to instead be operable as portion of a double-gate.

Figure 6:
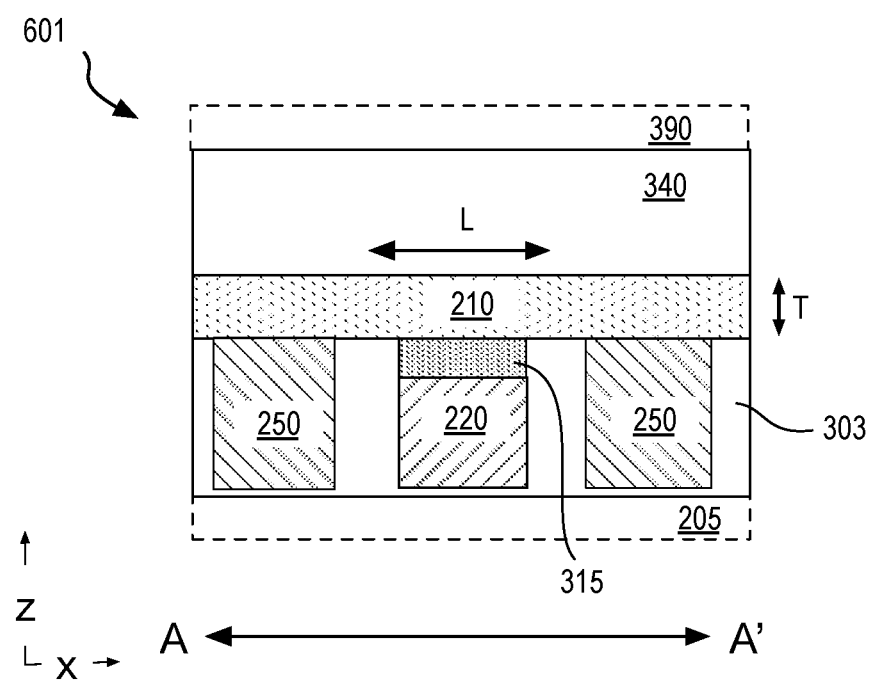

FIG. 6 illustrates a transistor structure 601 that includes a bottom-side gate electrode 220 along with bottom-side source/drain contact metallization 250. In this MOSFET architecture, gate dielectric 315 is again between gate electrode 220 and semiconductor body 210. Similar to transistor structure 401, transistor channel length L is dependent on physical dimensions of gate electrode 220, and also a lateral spacing between electrode 220 and source/drain contact metallization 250. In transistor structure 601, channel thickness T may again be significantly smaller than channel length L.

While transistor structure 601 may be fabricated according to a variety of techniques, methods 101 may be advantageously employed to convert a previously deposited precursor material into a metal chalcogenide to form semiconductor body 210 after source/drain metallization 250, gate dielectric 315, and gate electrode 220 have all been fabricated according to any suitable techniques. Transistor structure 601 may be fabricated, for example, by depositing the precursor material over source/drain metallization 250, and over the intervening gate stack. For bottom-side terminal architectures, complete conversion of the precursor material into semiconductor body 210 will ensure the bottom-side terminals are properly coupled to the semiconducting metal chalcogenide.

Figure 7:
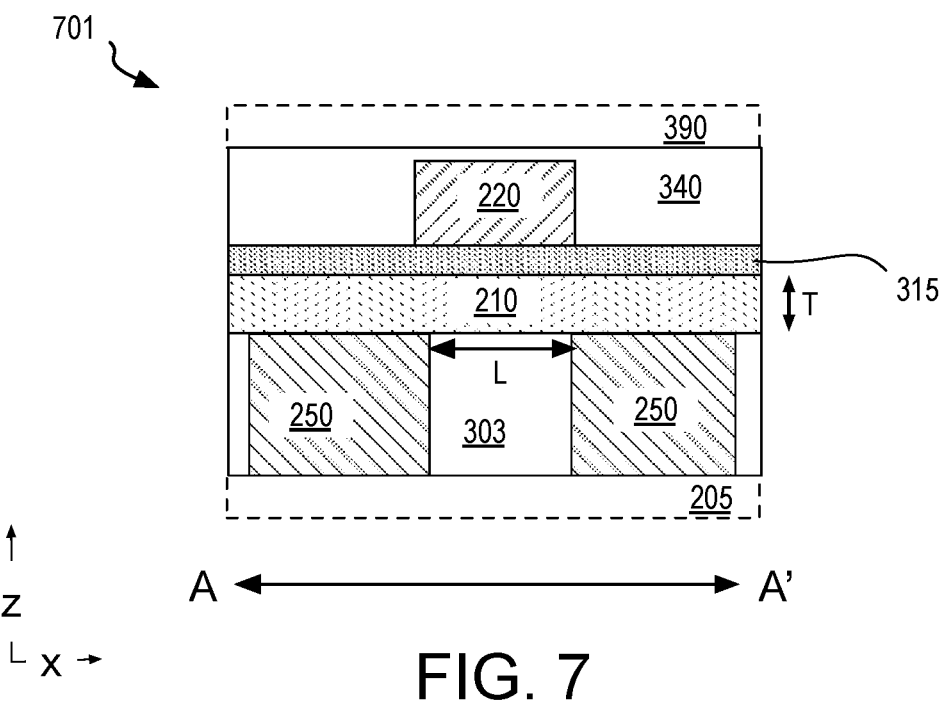

In FIG. 7, transistor structure 701 comprises gate electrode 220 on a top-side of semiconductor body 210 while source/drain contact metallization 250 is on a bottom side of semiconductor body 210. Device terminals of transistor structure 701 are inverted from those of transistor structure 301 (FIG. 3). As shown in FIG. 7, gate electrode 220 is therefore embedded within a dielectric material 340 while source/drain metallization 250 is embedded in dielectric material 303 on the side of substrate 205. In the "top-gate" architecture illustrated in FIG. 7, transistor channel length L is again dependent on the spacing of bottom side source/drain contact metallization 250, which may be defined by some minimum lithographic feature resolution (e.g., 10-20 nm pitch) Channel length L is independent of gate length (e.g., x-dimension) in this top gate architecture. Hence, gate electrode 220 may extend over source/drain metallizations 250 by an arbitrary amount and may even be present over the entire area of semiconductor body 210.

Transistor structure 701 may be fabricated according to various techniques, but according to methods 101 a precursor material may be deposited over dielectric material 303, and then converted into a metal chalcogenide to form semiconductor body 210. Upon complete conversion, source/drain metallization 250 are electrically coupled to the metal chalcogenide. Following formation of semiconductor body 210, gate dielectric 315 and gate electrode 220 may be deposited to arrive at transistor structure 701.

Figure 8:
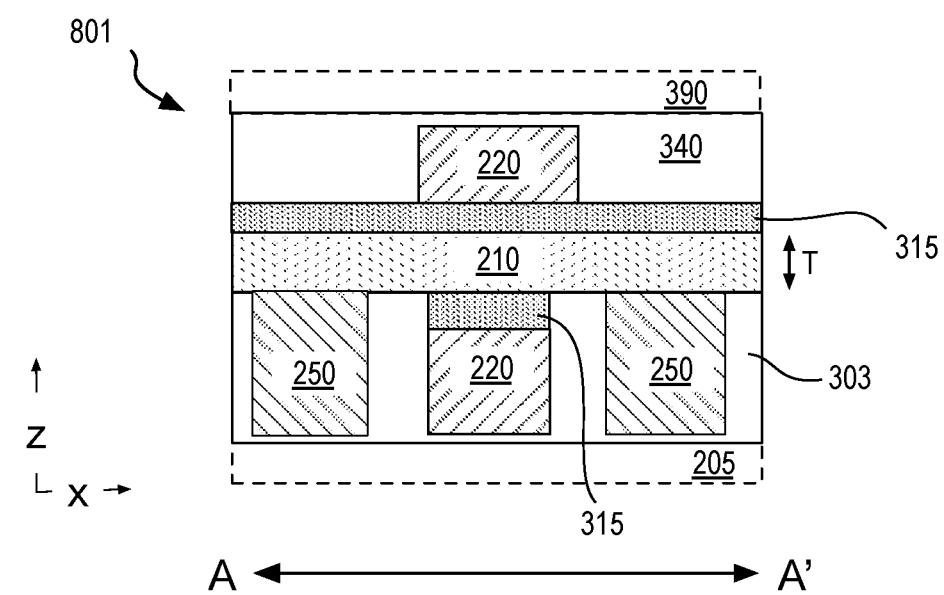

FIG. 8 depicts a double gate transistor structure 801 that includes features of both transistor structure 601 (FIG. 6) and transistor structure 701 (FIG. 7). Transistor structure 801 includes gate dielectric 315 under, and over, semiconductor body 210. Fabrication of transistor structure may therefore proceed with fabrication of source/drain metallization 250 and a first gate stack according to any suitable technique. A precursor material (e.g., metal or metal oxide) may then be deposited and converted into a metal chalcogenide (e.g., according to methods 101) to form semiconductor body 210. Subsequently, a second gate dielectric 315 and gate electrode 220 may be fabricated in any manner. The multi-gate architecture of transistor structure 801 may also be modified into a four terminal device where one of gate electrode 220 (top or bottom) is made electrically independent of the other. If desired, a corresponding one the gate dielectrics 315 may also be eliminated to arrive at a transistor structure similar to structure 501, albeit with terminal positions inverted.

Figure 9:
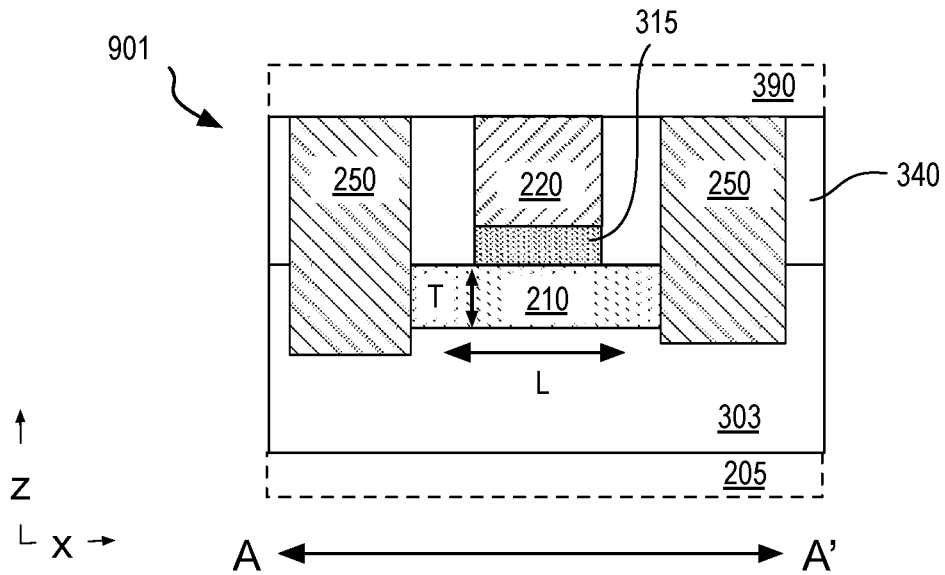

FIG. 9 illustrates a transistor structure 901 similar to the top-side terminal transistor structure 401 (FIG. 4). As shown in FIG. 9, however, source/drain metallization 250 intersects and/or is adjacent to sidewalls of semiconductor body 210. Noting that channel thickness T may be significantly less than 10 nm, source/drain terminals may extend through thickness T with contact to the semiconducting metal chalcogenide then occurring primarily through a sidewall of semiconductor body 210, and a sidewall of source/drain metallization 250. Any of the transistor architectures described above that include top-side source/drain metallization may similarly have source/drain terminals that couple through a sidewall of a metal chalcogenide semiconducting channel material.

As previously noted, methods 101 are well suited to forming transistor structures that include multiple channel materials. The multiple channels may be operable in electrical parallel, for example to reduce channel leakage or to implement a complementary switching logic. For embodiments where a relatively stable metal oxide precursor material is partially converted, remnant precursor material may be operable as a secondary transistor channel in parallel with a primary metal chalcogenide channel. The primary channel may have excellent low voltage characteristics while the secondary channel, with larger bandgap, may have excellent low leakage characteristics. For other embodiments where multiple precursor materials are iteratively converted into multiple distinct metal chalcogenides, the metals may be chosen so that the resulting semiconducting metal chalcogenides have complementary conductivity types. Electron and hole current may then be selected through the biasing of a single gate electrode (e.g., between −1V to 1V with the transistor in an off state at 0V).

Figure 10:
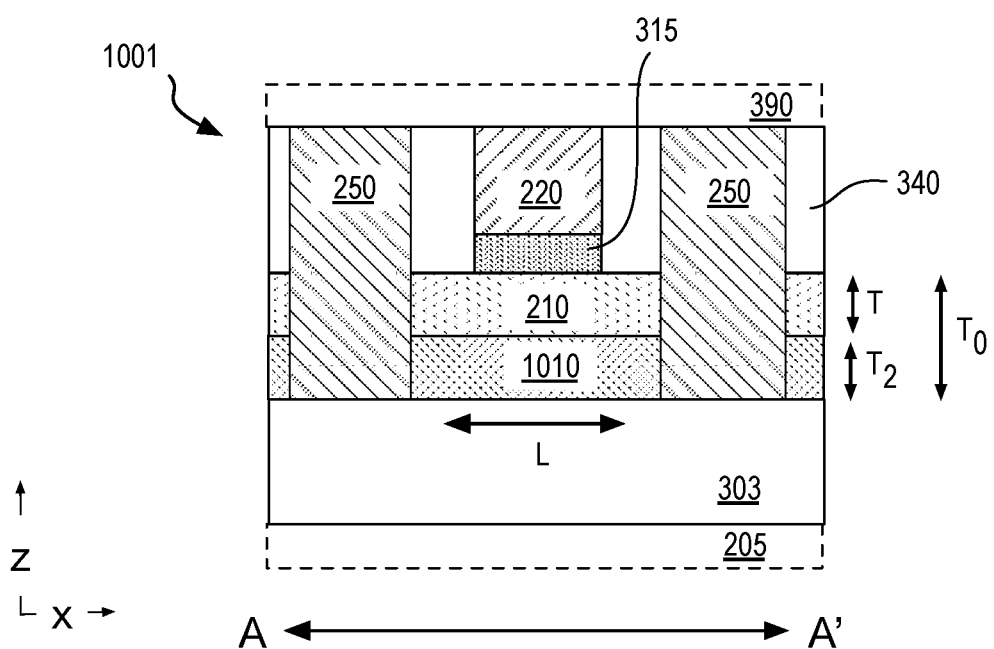

FIG. 10 illustrates one exemplary transistor structure 1001 that includes semiconductor body 210 over another semiconductor body 1010. As shown, top-side source/drain metallization 250 extends through both a channel thickness T and a second channel thickness $T_2$ to make contact with sidewalls of each semiconductor body 210 and 1010. Gate electrode 220 is over a top-side of semiconductor body 210 with gate dielectric 315 therebetween. Bias potential applied to gate electrode 220 during operation of transistor structure 1001 may control a channel region within each of semiconductor bodies 210 and 1010, particularly where channel thicknesses T and $T_2$ are each 10 nm, or less.

At least one of semiconductor bodies 210 and 1010 is a metal chalcogenide, for example having one or more of the attributes described above. In some embodiments semiconductor body 1010 is a metal oxide while semiconductor body 210 is a metal chalcogenide. For such embodiments, the metal oxide (e.g., IGZO) may be deposited over dielectric material 303 with any suitable thin film deposition technique. In some embodiments where the metal oxide is suitable for conversion into a metal chalcogenide, the metal oxide may be deposited to a thickness $T_o$. Subsequently, a top portion (of channel thickness T) may be converted to a chalcogenide of that metal while a bottom portion (of channel thickness $T_2$) is retained as a remnant. Conversion therefore splits the deposition thickness of $T_0$ across the primary and secondary channels. Upon formation of the metal chalcogenide, top side terminals may be fabricated according to any suitable techniques. In the example illustrated, semiconductor body 1010, potentially with a significantly larger bandgap than that of semiconductor body 210, may reduce off-state leakage between source/drain metallization 250.

In some other embodiments where semiconductor body 1010 is a semiconducting metal oxide and semiconductor body 210 is a semiconducting metal chalcogenide, the two semiconducting materials have complementary conductivities. For example, semiconductor body 1010, potentially with a conductivity type complementary (e.g., n-type) to that of semiconductor body 210 (e.g., p-type), may provide an electron current at a first bias state of gate electrode 220 while semiconductor body 210 may provide a hole current at a second bias state of gate electrode 220. Indium is one exemplary p-block metal that both semiconductor body 1010 and semiconductor body 210 may include. For example, semiconductor body 1010 may be $InO_x$ (comprising predominantly In and O), which is n-type, while semiconductor body 210 may be $InSe_x$ (comprising predominantly In and Se), which is p-type. Such a complementary transistor may therefore be in an on-state under both positive and negative gate biases with an off-state being between the two on-states (e.g., at nearly 0V gate bias).

In some other embodiments semiconductor body 1010 is a first metal chalcogenide while semiconductor body 210 is a second metal chalcogenide. For such embodiments, a first precursor material may be deposited over dielectric material 303 with any suitable thin film deposition technique. That precursor material may then be converted into the first metal chalcogenide of channel thickness $T_2$. Subsequently, second precursor (e.g., of thickness T) may deposited over the first metal chalcogenide and then converted to another metal chalcogenide. Upon formation of the two metal chalcogenides, top side terminals may be fabricated according to any suitable technique(s). In the example illustrated by FIG. 10, semiconductor body 1010, potentially with a conductivity type complementary (e.g., p-type) to that of semiconductor body 210 (e.g., n-type), may provide a hole current at a first bias state of gate electrode 220 while semiconductor body 210 may provide an electron current at a second bias state of gate electrode 220.

Figure 11:
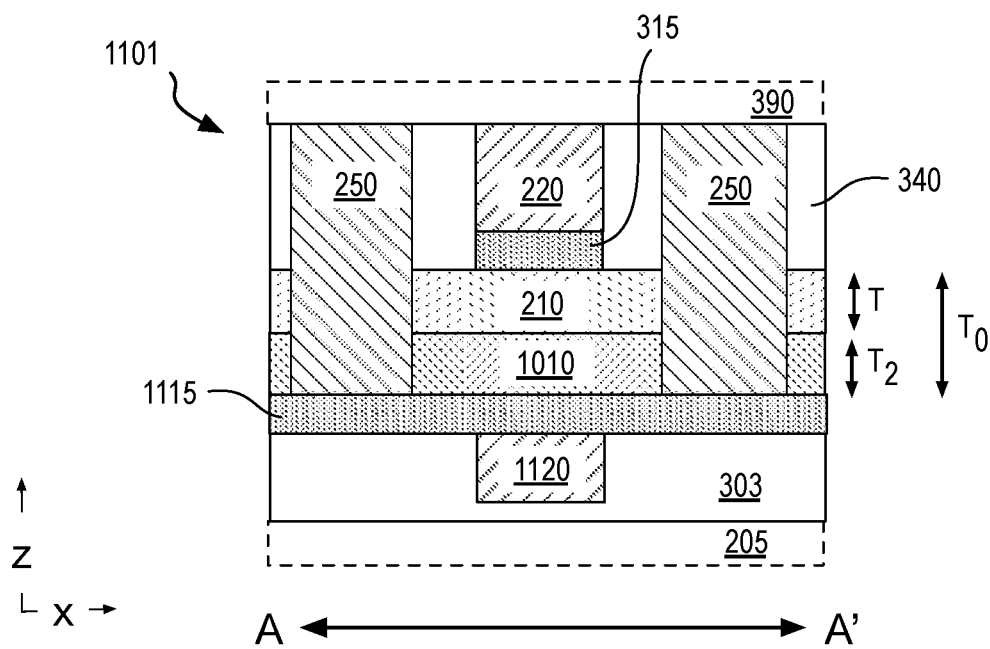

While transistor structure 1001 is most similar to transistor structure 901, most any single channel transistor architecture may be modified to include multiple semiconductor channel materials. For example, any of the transistor structures 201-801 may include a second semiconductor body in parallel with semiconductor body 210. FIG. 11 illustrates a transistor structure 1101 that includes a gate dielectric 1115 and gate electrode 1120 as an additional gate stack that may couple through a bottom side of semiconductor body 1010. Gate electrode 1120 may be electrically independent of gate electrode 220 so that a channel region within each of semiconductor body 210 and semiconductor body 1010 may be independently controlled by the separate gate electrodes 220, 1120. Similar to transistor structure 1001, semiconductor body 210 may be a metal chalcogenide while semiconductor body 1010 may be either a semiconducting metal oxide or another metal chalcogenide of distinct composition (e.g., having conductivity complementary to that of the first metal chalcogenide).

Figure 12:
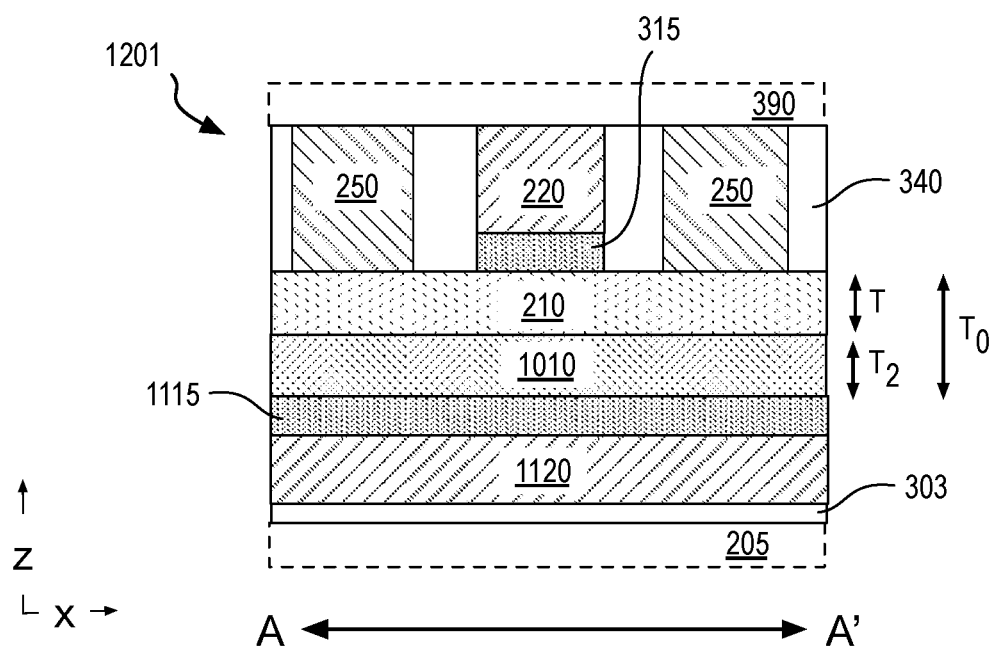

FIG. 12 illustrates a transistor structure 1201 that includes multiple gate dielectrics 315 and 1115, and multiple gate electrodes 220 and 1120, on opposite sides of two stacked semiconductor bodies 210 and 1010. Gate electrode 1120 may be electrically coupled to gate electrode 220 so that a channel region within each of semiconductor body 210 and semiconductor body 1010 are operable in parallel. Similar to transistor structure 1001, semiconductor body 210 may be a first metal chalcogenide while semiconductor body 1010 may be either a semiconducting metal oxide or another metal chalcogenide of distinct composition (e.g., having the same conductivity as that of the first metal chalcogenide).

Transistor structures 1101 and 1201 may be fabricated, for example, with deposition of a semiconducting metal oxide over a bottom gate dielectric material 1115 and a bottom gate electrode 1120. The semiconducting metal oxide may be deposited to a thickness of $T_0$, for example. Next, a top portion (with a channel thickness of T) is converted to a metal chalcogenide with a bottom portion (of channel thickness $T_2$) remaining metal oxide. With semiconductor bodies 1010 and 210 so formed, top-side gate dielectric 315 and top-side gate electrode 220 may be fabricated according to any suitable technique(s). Source/drain metallization 250 may be similarly fabricated over a top-side of the stack of semiconductor bodies 210, 1010. In the example of FIG. 12, source/drain metallization 250 lands on semiconductor body 210. Conduction through a parallel channel region within semiconductor body 1010 may be direct where both the metal chalcogenide of semiconductor body 210 and metal oxide of semiconductor body 1010 are of the same conductivity type (e.g., n-type). Carrier tunneling may occur if there is a significant carrier (e.g., conduction) band offset between the metal oxide of semiconductor body 1010 and metal chalcogenide of semiconductor body 210.

Figure 13:
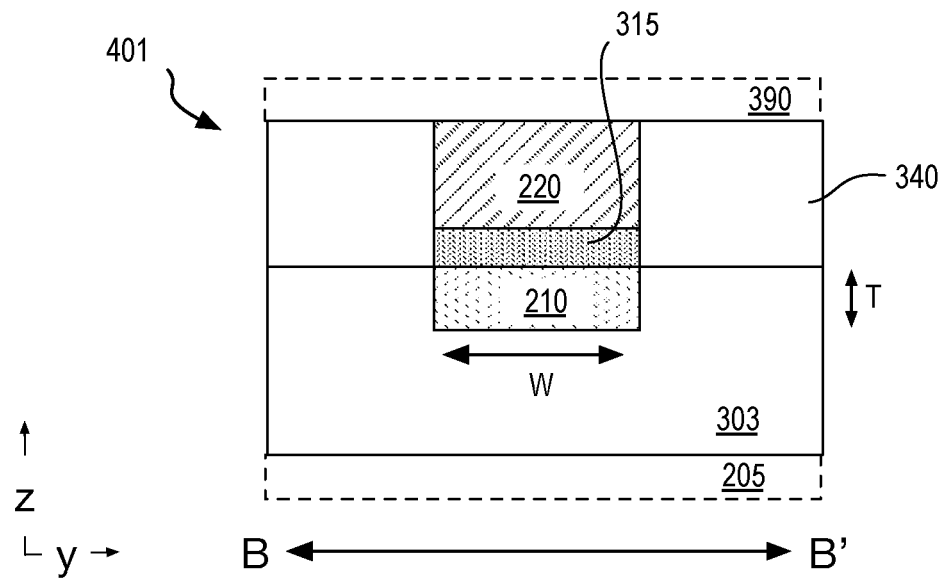
FIGS. 13 and 14 are cross sectional views of transistor structures including a metal chalcogenide channel material along the B-B' line introduced in FIG. 2, in accordance with some embodiments.

FIG. 13 is a second cross-sectional view of transistor structure 401 (introduced in FIG. 4) along the B-B' line through gate electrode 220, as illustrated in FIG. 2. As shown, a channel region of semiconductor body 210 has a channel width W that is larger than channel thickness T. Channel width W may be, for example, a minimum lithographically defined feature geometry (e.g., 10-30 nm) while channel thickness T may be significantly below 10 nm. As further denoted in FIG. 13, gate electrode 220 is only over semiconductor body 210. Even so, gate control for such transistor structures can still be expected to be excellent suffering minimal short channel effects, in part, because the channel thickness T is so small that the channel may be considered substantially 2D. Nevertheless, any of the planar channel architectures illustrated above (e.g., FIG. 4-12) may further comprise a wrap-around gate stack architecture where the gate electrode is adjacent to a sidewall of the metal chalcogenide in addition to being over (or under) the metal chalcogenide. For example, in the context of FIG. 13 gate electrode 220 and gate dielectric 315 may both extend beyond the edges of semiconductor body 210 to further interface with a sidewall of semiconductor body 210. Such sidewall coupling may be supplemental to planar surface coupling. Alternatively, sidewall gate coupling to a metal chalcogenide body may be relied upon exclusively.

Figure 14:
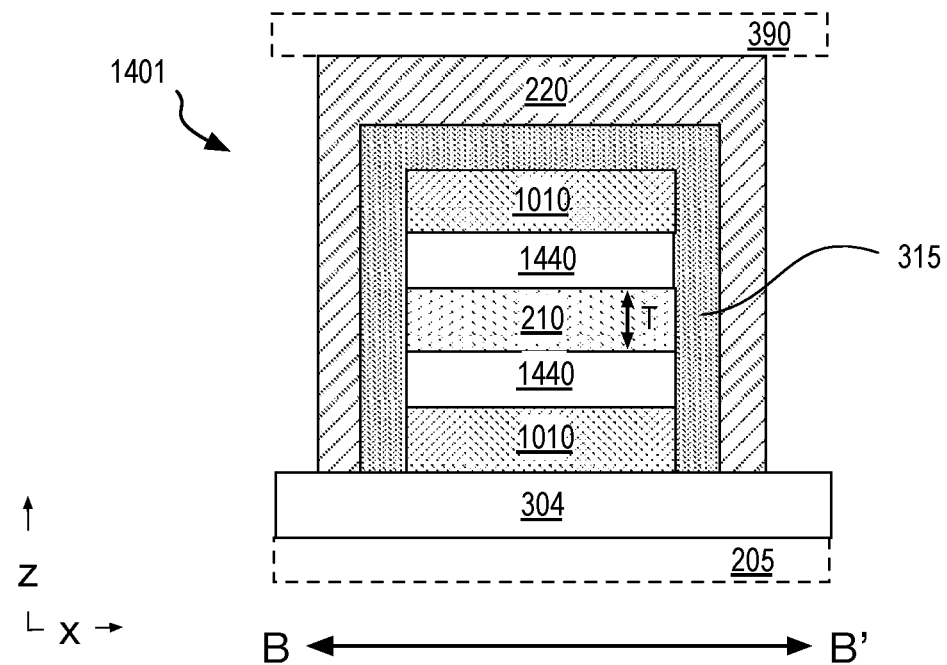

Sidewall gate coupling architectures may include one or more semiconductor material (e.g., metal chalcogenide and/or metal oxide) layers in a stack over which there is a gate electrode that couples to any or all of the semiconductor material layers of the stack through the material layer sidewall. FIG. 14 is a cross-sectional illustration through a transistor structure 1401, substantially along the B-B' line through the gate electrode 220, as illustrated in FIG. 2. In FIG. 14, transistor structure 1401 includes a stack of semiconductor bodies 210 and 1010. In some embodiments, each of semiconductor bodies 210 and 1010 is a metal chalcogenide semiconductor material, for example having one or more of the attributes described above. In other embodiments, one or semiconductor body 210 or 1010 is a metal oxide semiconductor material while the other is a metal chalcogenide semiconductor material. A dielectric material 1440 is between individual ones of semiconductor bodies 210 and 1010 to electrically insulate adjacent semiconductor bodies 210 and 1010 from each other. Dielectric material 1440 may be any of those materials described above for dielectric material 340, for example.

Multiple, iterative thin film material depositions may be practiced to generate the semiconductor/dielectric material stack illustrated in FIG. 14. Each metal chalcogenide semiconductor material within the stack may be formed with the precursor/conversion process described elsewhere herein, for example. After completing the stack deposition, the semiconductor/dielectric material stack may be patterned, for example to form access vias. A gate stack comprising gate dielectric 315 and gate electrode 220 may then be deposited in the access vias so that the gate stack is adjacent to a sidewall of the semiconductor/dielectric material stack substantially as shown for transistor structure 1401. After completing the gate stack deposition, the semiconductor/dielectric material stack may be patterned again, for example to form second access vias on opposite sides of the gate stack. Source/drain metallization (not depicted as being out of the plane of FIG. 14) may then be deposited into the second access vias so that the source/drain metallization is adjacent to a sidewall of the semiconductor/dielectric material stack.

Transistor structures having non-planar channel architectures are also possible. For such embodiments, a semiconductor body comprising a metal chalcogenide (e.g., including a p-block and/or a d-block metal) is over a topographic feature with a transistor channel width and/or length then being decoupled from the area/footprint of the transistor structure. In contrast to a non-planar gate electrode strapping over a plurality of semiconductor bodies in transistor structure 1401, some transistor structures with a non-planar channel architecture include a semiconductor body that is over a sidewall of one or more transistor terminals (e.g., gate electrode), or mandrel structures.

Figure 15A:
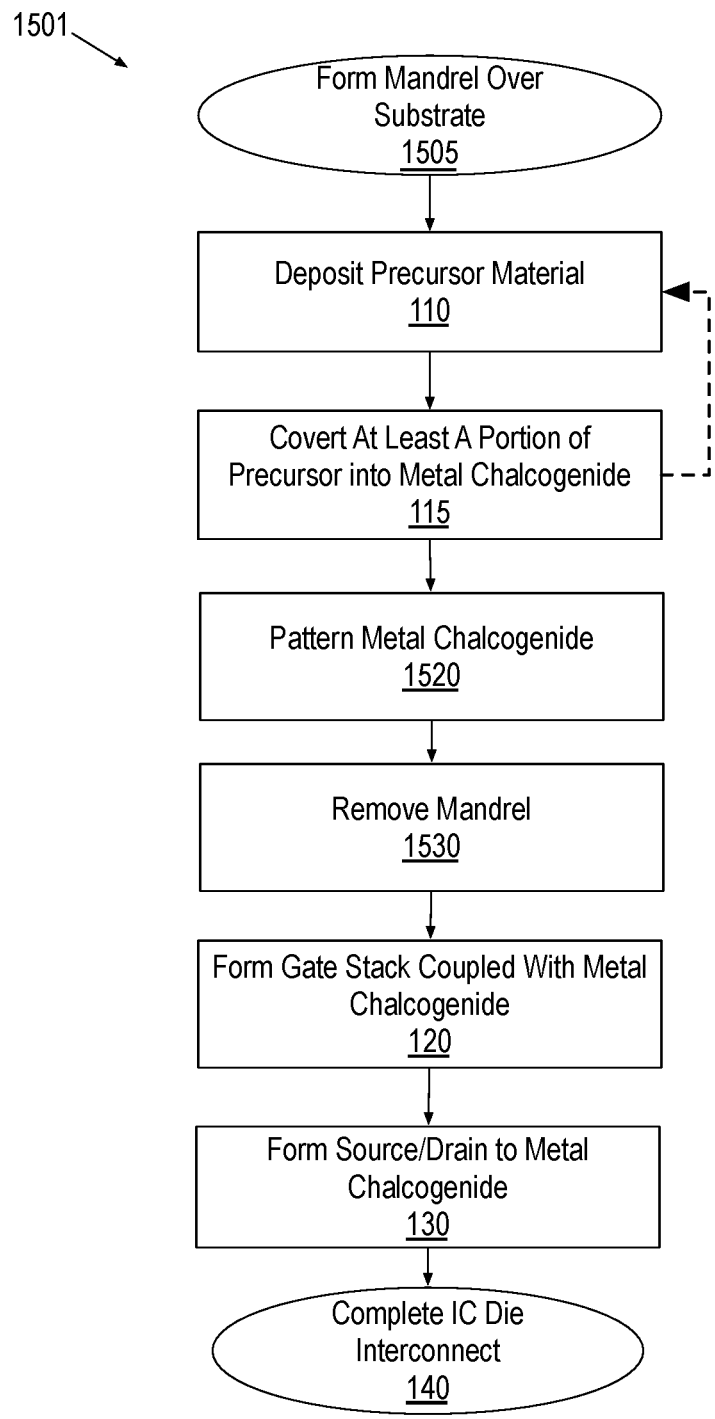
FIGS. 15A and 15B are flow diagrams illustrating methods of fabricating transistor structures, in accordance with some embodiments.
Figure 15B:
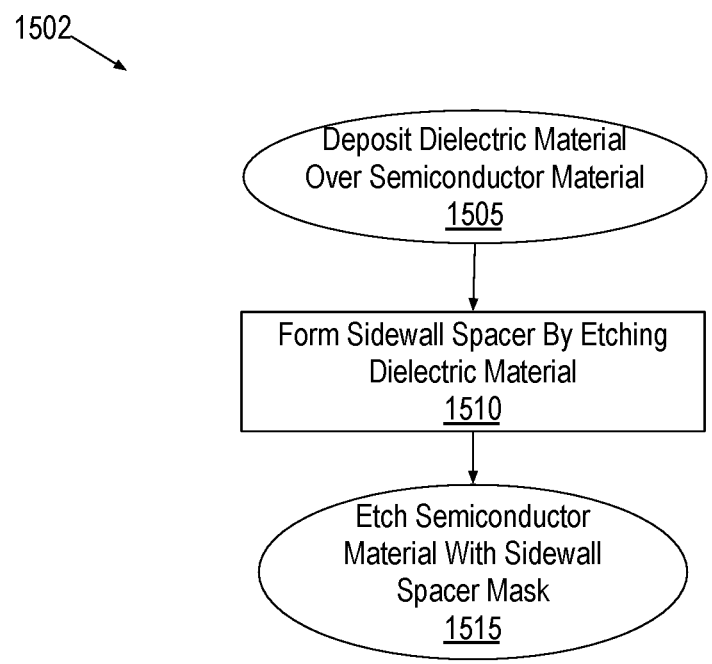

FIG. 15A illustrates a flow diagram for methods 1501 of forming a non-planar semiconductor body comprising a metal chalcogenide. Methods 1501 begin at block 1505 where a mandrel is formed over a substrate. The substrate may be any of the exemplary substrates described elsewhere herein. The mandrel may be sacrificial, or a permanent feature of a transistor structure. In some embodiments, the mandrel comprises a dielectric material that is patterned into a feature, such as, but not limited to, a pillar, a line, or any other polygon known to be suitable as a backbone double-patterning (e.g., pitch splitting) process. For other embodiments, for example where the mandrel is to further functional as a terminal of the transistor structure, the mandrel may comprise any of a gate electrode (and gate dielectric), a source terminal contact metallization, or a drain terminal contact metallization.

Methods 1501 then proceed to block 110 where the precursor material is deposited, for example substantially as described above for methods 101. For methods 1501 however, the precursor material is deposited over at least a sidewall of the mandrel, and in some embodiments the precursor material is blanket deposited over the top surface and sidewall of the mandrel structure, as well as over a field portion of the substrate between adjacent mandrel structures. At block 115, at least a portion of the precursor material may then be converted into a metal chalcogenide, for example substantially as described above for methods 101. Alternatively, where a conversion process is not employed, a metal chalcogenide material may be directly deposited over a mandrel structure. Hence, while methods 1501 illustrate the integration of the precursor conversion technique introduced in methods 101, methods 1501 do not require the precursor conversion technique and instead can employ a direct metal chalcogenide deposition.

Figure 16A:
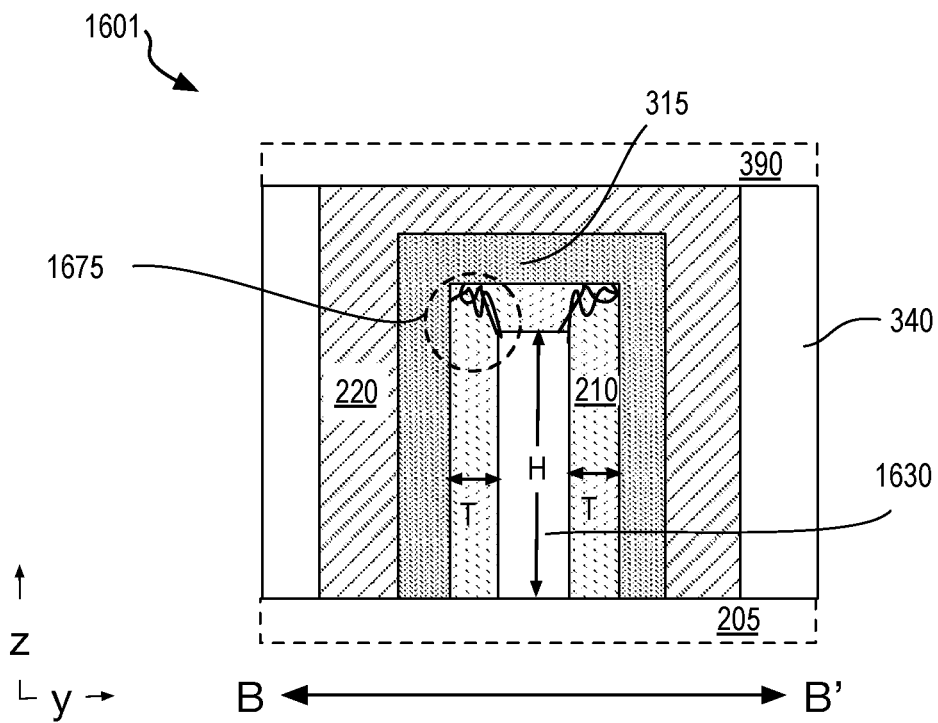
FIGS. 16A, 16B, 16C, 16D, 16E, 16F, 16G, 16H, 16I and are cross sectional views of transistor structures including a metal chalcogenide channel material along the B-B' line introduced in FIG. 2, in accordance with some embodiments.

Methods 1501 continue at block 1520 where the metal chalcogenide material is patterned into separate semiconductor bodies. Because metal chalcogenide material layers may be so thin (e.g., a few monolayers), self-aligned patterning techniques are advantageous. In some embodiments, the metal chalcogenide is directly etched anisotropically to remove the metal chalcogenide between mandrel structures while retaining the metal chalcogenide material on at least the sidewall of the mandrel structures as the semiconductor body. Where an etch rate of the metal chalcogenide is sufficiently independent of aspect ratios and/or microloading, or other etch phenomena, metal chalcogenide may be retained only on a sidewall of a mandrel structure. FIG. 16A further illustrates an example where semiconductor body 210 is on a sidewall of mandrel structure 1630.

With the semiconductor body present, methods 1501 (FIG. 15A) may continue at block 1530 where the mandrel structure is selectively removed in sacrificial mandrel embodiments. A mandrel structure may be removed from the front or back side of the semiconductor body and replaced with another structure, such as a gate electrode, structure. It may be advantageous to access a bottom (back) side of a semiconductor body subsequent to its formation. For example, in some embodiments the back side of a precursor material layer may be accessed at block 1530, and the precursor material then converted into a metal chalcogenide semiconductor body from the back side (e.g., at block 115). In other examples, stress in a metal chalcogenide semiconductor body (or precursor material) may be induced or relieved by exposing a bottom side of the metal chalcogenide or precursor material at block 1530.

In non-sacrificial mandrel embodiments of methods 1501, block 1530 may be skipped and a gate stack and source/drain terminals formed at blocks 120 and 130 according to any suitable technique(s). Methods 1501 may then be completed at block 140, substantially as described elsewhere herein.

In further reference to FIG. 16A, transistor structure 1601 includes a high-density crystalline defect zone 1675 within non-planar semiconductor body 210 at the interface of sidewall and top surface portions of semiconductor body 210. High-density crystalline defect zone 1675 is indicative of strain within semiconductor body 210. In accordance with some embodiments, such strain may be reduced by replacing mandrel structure 1630 subsequent to the deposition of a precursor material, or subsequent to formation of a metal chalcogenide semiconductor material (by conversion or direct deposition). Replacement of mandrel structure 1630 may by backside processing, for example, in which substrate 205 is removed either globally (e.g., wafer-level) or locally to transistor structure 1601 to expose mandrel structure 1630. Once exposed, a selective etch may be employed to remove mandrel structure 1630 and expose semiconductor body 210. Upon exposure, a conversion process may be performed (e.g., block 115), or any thermal anneal, etc. suitable for improving (e.g., reducing) stress within semiconductor body 210.

Transistor structure 1601 includes a gate dielectric 315 and gate electrode 220 over a non-planar semiconductor body 210 that has been deposited over mandrel structure 1630. Semiconductor body 210 therefore has a channel width that is approximately equal to twice a height H (e.g., z-dimension) of mandrel structure 1630 summed with a width (e.g., y-dimension) of mandrel structure 1630. Height H may be vary, but is generally greater than channel thickness T, and may be 20-50 nm for example. The channel width associated with transistor structure 1601 may therefore scale better than a structure having a planar channel. For transistor structure 1601, the gate stack is adjacent to only one sidewall of a semiconductor body 210, and another sidewall of semiconductor body 210 is in contact with mandrel structure 1630. Where mandrel structure 1630 is a dielectric material, semiconductor body 210 may be modeled as floating body. Because semiconductor body 210 may have a channel thickness T (normal to a sidewall of mandrel structure 1630) of only a few monolayers, gate control over the non-planar 2D channel can be very good.

Formation of semiconductor body 210 may be according to a variety of techniques including additive techniques (e.g. selective deposition) and subtractive techniques. In one subtractive technique, a layer of semiconductor material (or a precursor material) is blanket deposited and then etched back to form a self-isolated semiconductor body 210. An unpatterned anisotropic etch may be practiced, for example, where microloading or other etch phenomena reduce the etch rate of semiconductor material on a top surface of mandrel structure 1630 relative to an etch rate of the semiconductor material between adjacent mandrel structures.

Figure 16B:
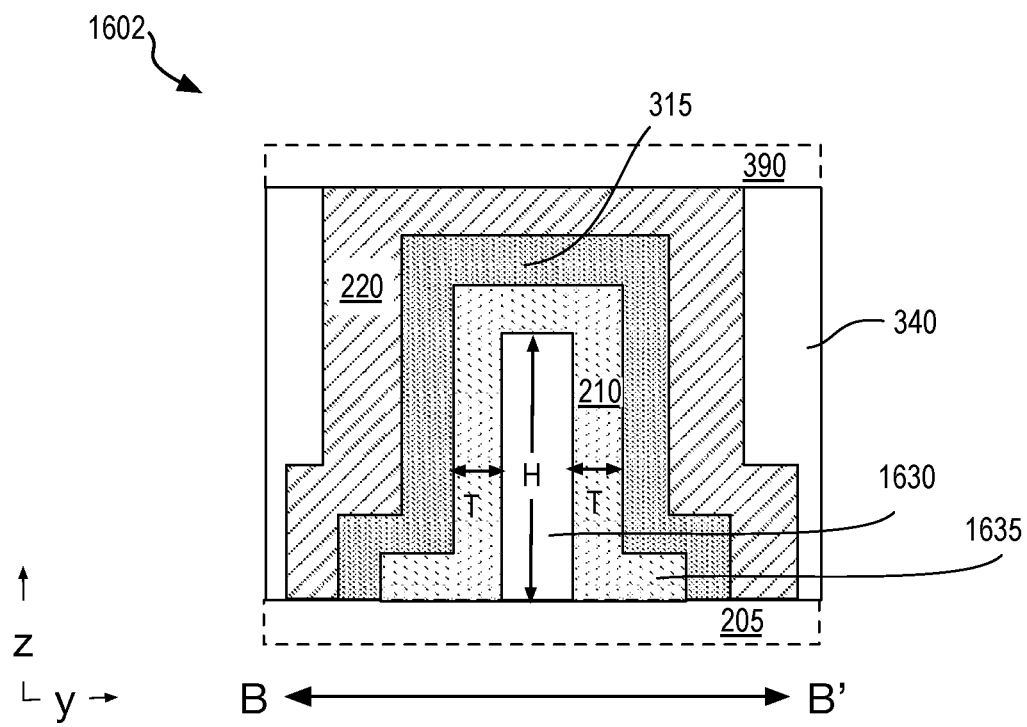

Alternatively, a self-aligned patterning mask may be employed, for example according to methods 1502 (FIG. 15B) where a dielectric material is deposited over a layer of semiconductor material (or precursor material) at block 1505. Then, at block 1510, the dielectric material may then be blanket etched anisotropic ally to generate a dielectric sidewall spacer adjacent to a sidewall of the semiconductor material. The sidewall spacer may then function as a self-aligned mask during an etch of the semiconductor material at block 1515. FIG. 16B illustrates an exemplary transistor structure 1602 that is substantially the same as transistor structure 1601 except in transistor structure 1602 semiconductor body 210 further includes a characteristic foot 1635, which is indicative of a patterning process that includes a sidewall spacer mask that had a lateral width approximately equal to the width (e.g., y-dimension) of foot 1635.

Figure 16C:
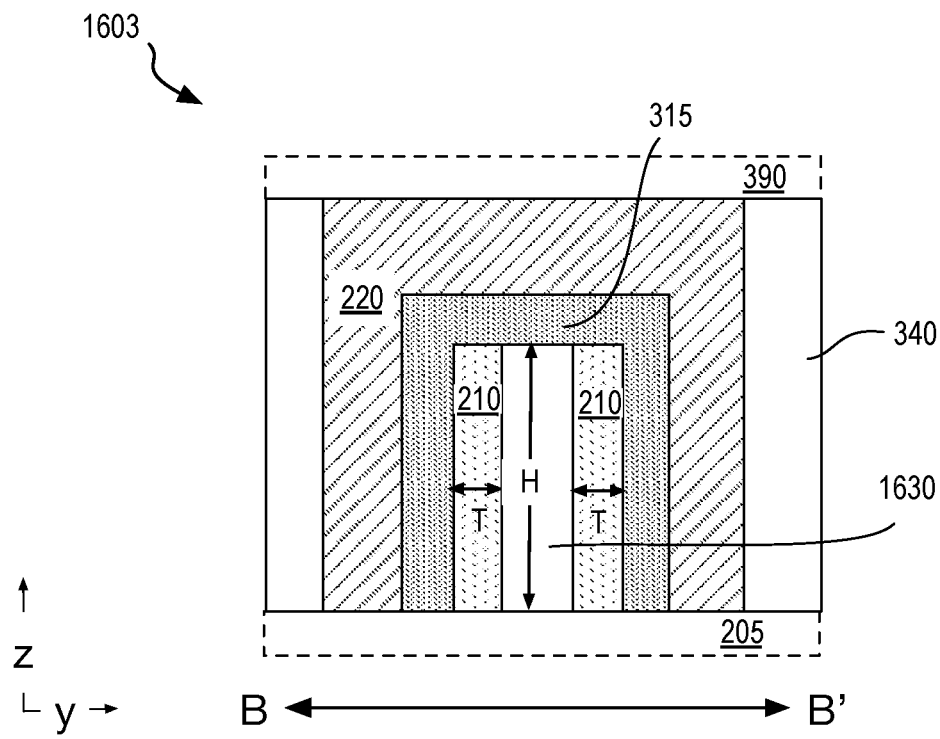

FIG. 16C illustrates another exemplary transistor structure 1603 that also includes a single gate electrode 220 adjacent to a sidewall of semiconductor body 210. Transistor structure 1603 is similar to transistor structure 1601, however in transistor structure 1603 semiconductor body 210 has a top surface that is substantially planar with a top surface of mandrel structure 1630 (e.g., both have the same height H). Transistor structure 1603 may be formed for example when an unpatterned anisotropic etch of a semiconductor material exposes a top surface of mandrel structure 1630 with semiconductor body 210 retained as only a self-aligned spacer along the sidewall of mandrel structure 1630. The resulting semiconductor body 210 may be a single (e.g., cylindrical) structure. Alternatively, in embodiments where transistor structure 1603 is patterned in the second planar dimension (e.g., x-dimension) so that each illustrated semiconductor body 210 is separated from each other, transistor structure 1603 comprises two separate transistor channels that may be controlled by a single gate stack. Each semiconductor body 210 may further share a single source and single drain terminal (not depicted), or each semiconductor body 210 may be coupled to different source and/or drain terminals.

Figure 16D:
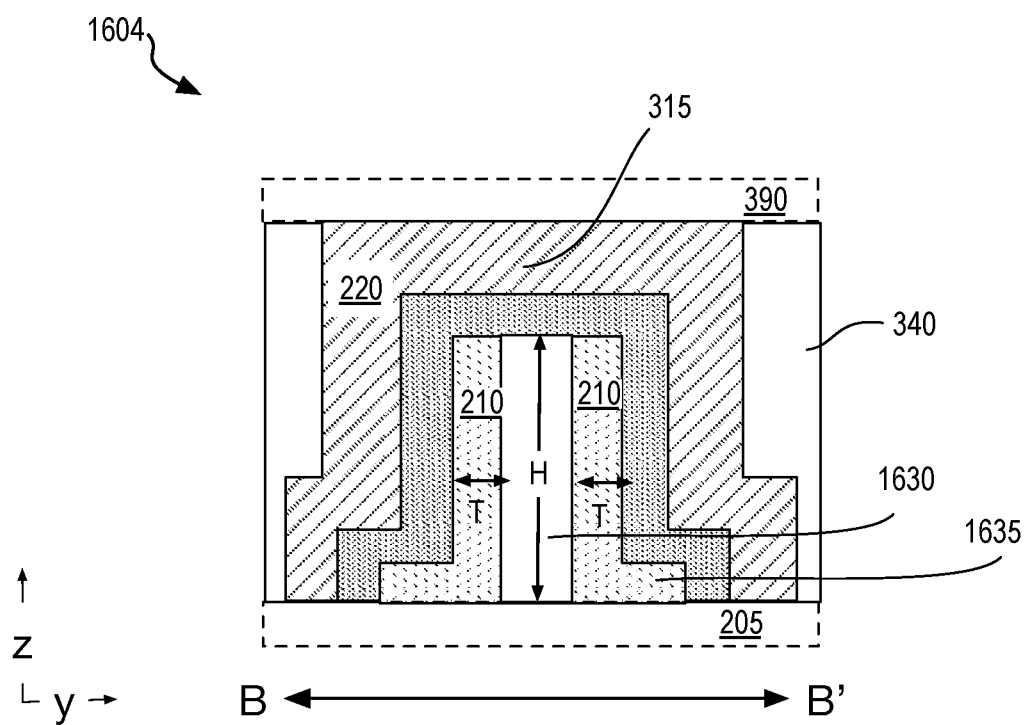

FIG. 16D illustrates another transistor structure 1604 in which semiconductor body 210 again has a height H (e.g., z-dimension) that is substantially planar with the height H of mandrel structure 1630, and further includes foot 1635. Transistor structure 1604 is therefore indicative of a spacer patterning process in which a top surface of mandrel 1630 was exposed during a self-aligned spacer masked etch of semiconductor material.

Figure 16E:
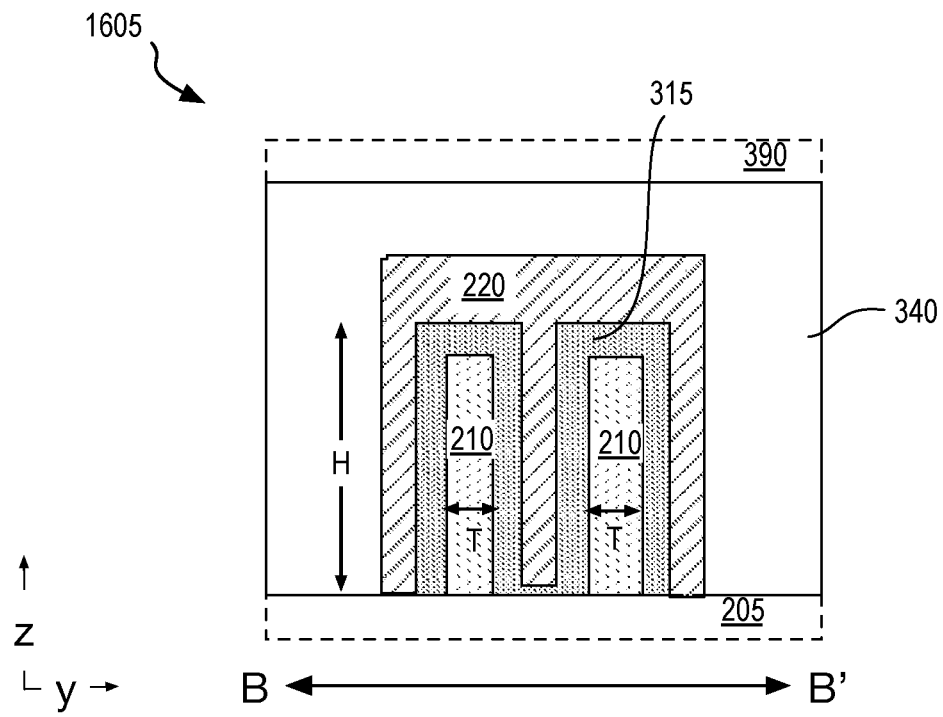

As noted above, a mandrel structure may be sacrificial. FIG. 16E further illustrates an alternative transistor structure 1605 where the mandrel structure was removed (e.g., from transistor structure 1602) prior to formation of the gate electrode with the gate stack replacing the mandrel structure. Removal of a mandrel structure may not be needed for the sake of channel control since the semiconductor body may have a channel thickness T (e.g., y-dimension) of only a few monolayers and can be adequately controlled with a single-side gate. However, removal of the mandrel structure may nevertheless offer other advantages, such as enabling a complete conversion of a precursor material where conversion of an outer skin of the precursor material limits the conversion process to less than the precursor material thickness. For example, once the mandrel structure has been removed, conversion may be through chalcogenization of opposing sidewalls of each semiconductor body 210. Gate electrode 220 and gate dielectric 315 may then be formed over and/or adjacent to each semiconductor body 210, filling in between neighboring semiconductor bodies 210, as shown in FIG. 16E. Although not depicted, a semiconductor foot (e.g. of the type illustrated in FIGS. 16B and 16D) may also be present in transistor structure 1605, for example where methods 1502 (FIG. 15B) are employed to pattern a metal chalcogenide (or precursor thereof).

Figure 16F:
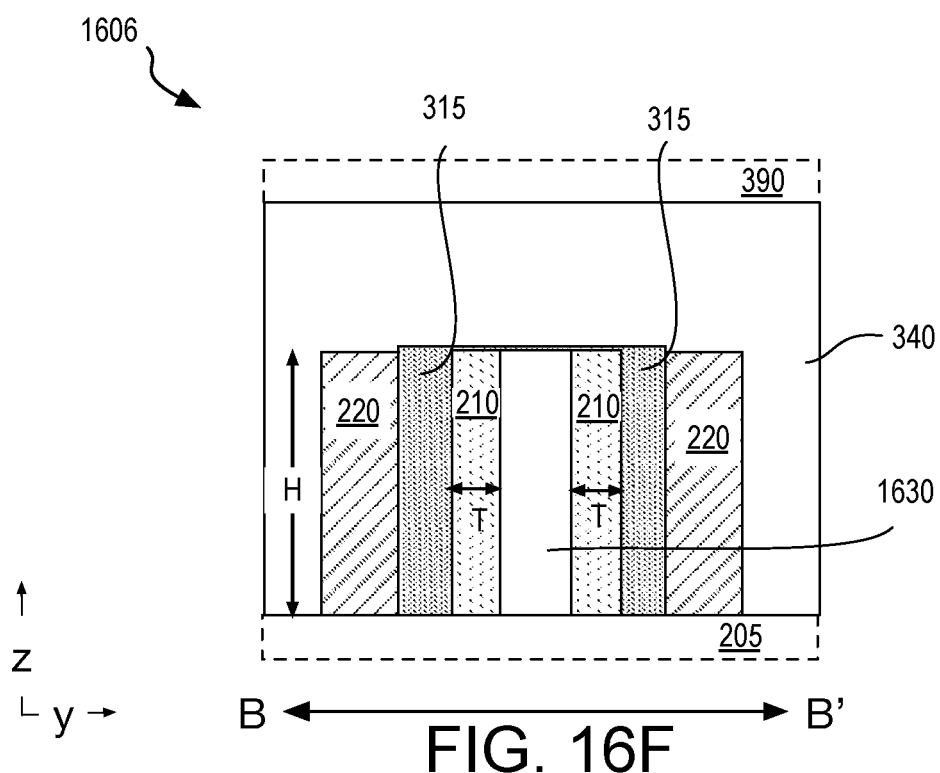

While the non-planar transistor structures described above comprise a single gate electrode 220 coupled to multiple semiconductor bodies, each single semiconductor body may instead be coupled to a single gate electrode. In some embodiments, gate stack formation (e.g., block 120 of methods 1501) includes planarizing a gate stack down to the height H of an underlying semiconductor body. Such a planarization may separate a gate electrode material layer into separate gate electrodes. FIG. 16F illustrates an exemplary transistor structure 1606, which may be fabricated by planarizing gate electrode 220 of transistor structure 1603 (FIG. 16C), for example. As shown in FIG. 16F, two adjacent semiconductor bodies 210 are separated by mandrel structure 1630 with gate dielectric 315 adjacent (e.g., y-dimension) to an outer sidewall of semiconductor bodies 210. Gate electrode 220 is adjacent to gate dielectric 315. A top surface of gate dielectric 315 (or mandrel structure 1630) is substantially planar with a top surface of gate electrode 220. In embodiments where transistor structure 1606 has been patterned in the second planar dimension (e.g., x-dimension) so that each illustrated semiconductor body 210 and/or gate electrode 220 is separated from each other, transistor structure 1606 comprises two separate transistor channels that may be independently controlled. Although not depicted, a semiconductor foot (e.g. of the type illustrated in FIGS. 16B and 16D) may also be present in transistor structure 1606, for example where methods 1502 (FIG. 15B) are employed to pattern a metal chalcogenide (or precursor thereof).

Figure 16G:
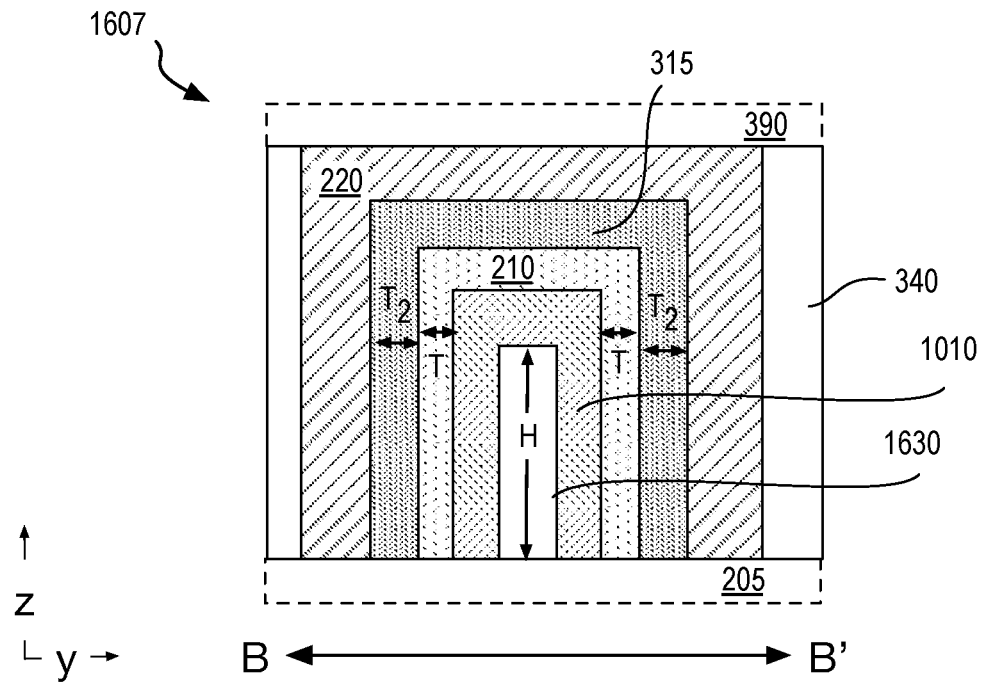

In some embodiments, non-planar architectures employing a mandrel structure include more than one semiconductor body with at least one of the semiconductor bodies including a metal chalcogenide. FIG. 16G, for example, illustrates a transistor structure 1607 that similar in architecture to transistor structure 1601 (FIG. 16A), however transistor structure 1607 includes both a non-planar semiconductor body 210 and a non-planar semiconductor body 1010 layered over at least a sidewall of mandrel structure 1630. Transistor structure 1607 is therefore a non-planar architecture that may have any of the multi-channel attributes described above for transistor structure 1001. Where mandrel structure 1630 comprises dielectric material 303, for example, transistor structure 1607 along the orthogonal A-A' plane may be substantially as illustrated in FIG. 10.

Figure 16H:
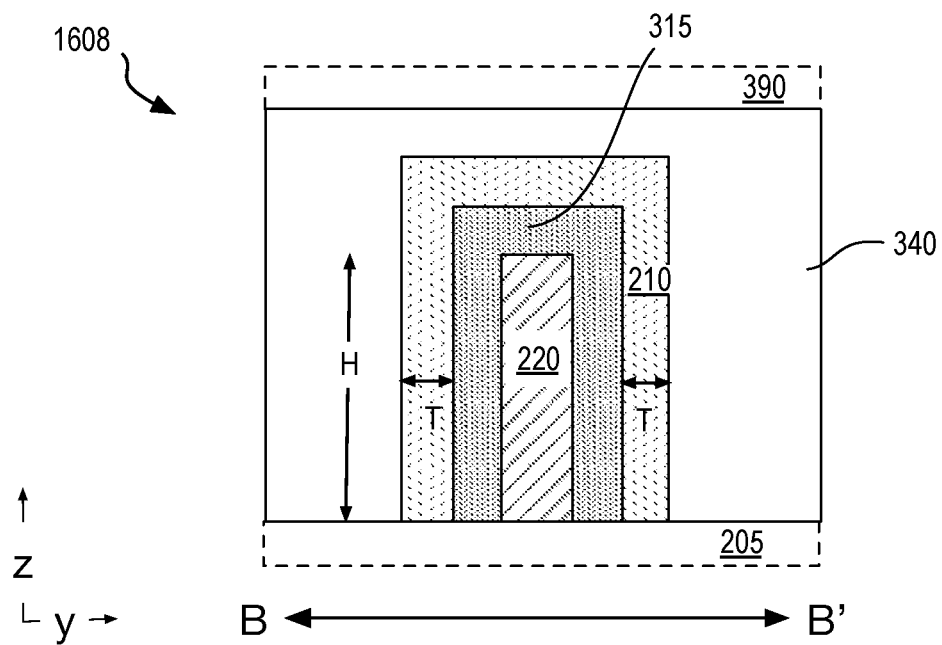

As noted above, a mandrel structure need not be a dielectric, but may instead be an alternative material, such as a metal. For some non-sacrificial mandrel embodiments, the mandrel structure may include a gate stack with the mandrel then functionally operable as a gate electrode of the non-planar transistor structure. Such embodiments are similar to the planar bottom gate electrode architectures described above, however non-planarity of the gate stack imparts non-planarity in the semiconductor body that may again offer scaling superior to a planar architecture. FIG. 16H illustrates a transistor structure 1608 that comprises a non-planar gate stack including a gate electrode 220 that has been patterned into a feature, such as a pillar or fin. Gate dielectric 315 is adjacent to a sidewall of gate electrode 220 and semiconductor body 210 is adjacent to a sidewall of gate dielectric 315. As such, transistor structure 1608 is similar to transistor structure 1601 (FIG. 16A), with the material layering orders reversed. Notably, transistor structure 1608 may also be fabricated by replacing a sacrificial mandrel (e.g., from backside processing that removes substrate 205) with a gate stack deposited subsequent to the formation of semiconductor body 210. The presence or absence of high-density defect zones within semiconductor body 210 along with other structural attributes may serve to distinguish a transistor structure that was fabricated with a mandrel-replacement method from one fabricated with a non-sacrificial mandrel method.

Figure 16I:
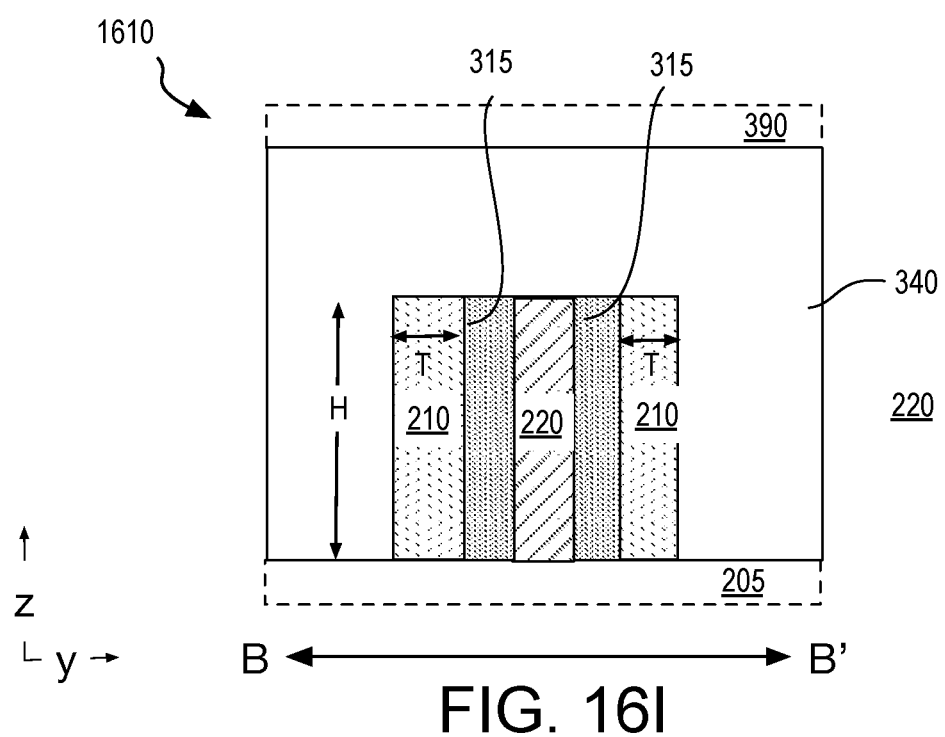

Any of the alternative architectures described in the context of FIG. 16B-16G are also applicable to transistor structure 1608. For example, semiconductor body 210 may again include foot, and/or may be planarized to have a same height H as gate electrode 220. As another example, FIG. 16I illustrates a transistor structure 1610 in which semiconductor body 210 has been planarized to the height H of gate electrode 220. When compared to transistor structure 1606 (FIG. 16F), transistor structure 1610 has a single gate electrode for two semiconductor bodies 210 while transistor structure 1606 has one gate electrode for each semiconductor body for embodiments where there has been a patterning in the x-dimension that bifurcates the symmetrical sides of the structures. In embodiments where semiconductor body 210 and gate electrode 220 are cylindrical or annular structures, the interior/exterior positions of semiconductor body 210 and gate electrode 220 for transistor structure 1610 are reversed.

In other embodiments, a semiconductor body is made non-planar by forming the metal chalcogenide in a recess. Transistor structure 1610, for example, is similar to planar transistor structure 301 except gate electrode 220 is non-planar, for example through a patterned etch, as illustrated, or as a result of depositing gate electrode 220 into a recess formed in dielectric material 303. Semiconductor body 210, formed over a non-planar surface of gate electrode 220 is therefore also non-planar with source and/or drain contact metallization 250 in contact with elevated portions of semiconductor body 210.

While the transistor structures including a planar or non-planar semiconductor metal chalcogenide body described above have a horizontal channel orientation (e.g., in one x-y plane), a transistor structure including a metal chalcogenide may include a vertically-oriented channel where a first of the source or drain metallization is in a different x-y plane than a second of the source or drain metallization. In this class of vertically oriented non-planar architectures, a channel portion of the metal chalcogenide semiconductor material vertically separates source metallization from drain metallization.

Figure 17A:
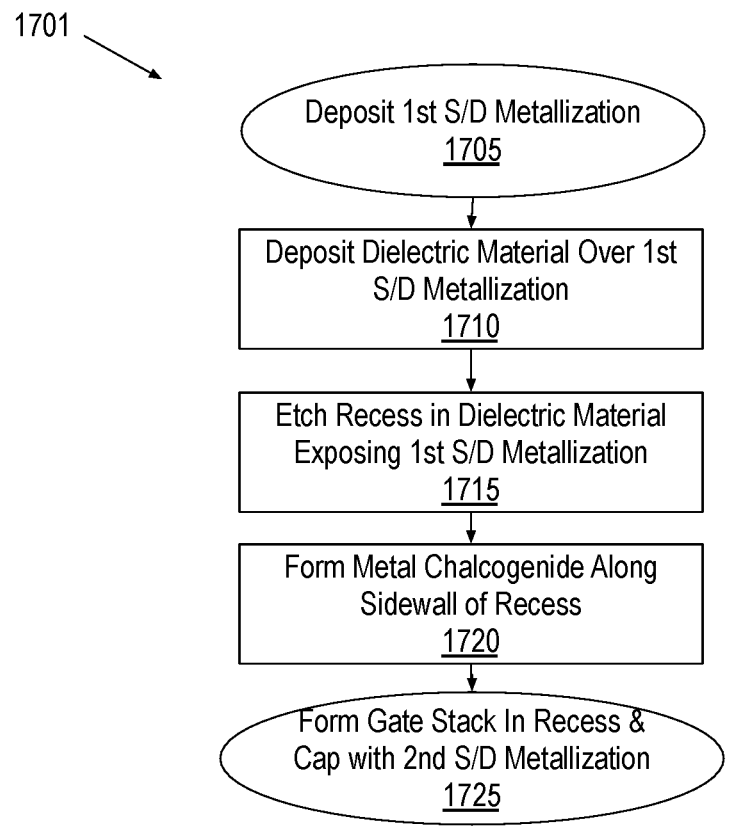
FIG. 17A is a flow diagram illustrating methods of fabricating transistor structures, in accordance with some embodiments.

In FIG. 17A, for example, methods 1701 begin at block 1705 where a first source/drain metallization is formed over a substrate. At block 1710 any suitable dielectric material may then be deposited over the first source/drain metallization. A recess (e.g., a trench) is then formed through the dielectric material at block 1715, exposing the first source/drain metallization at a bottom of the recess. Methods 1701 continue at block 1720 where the metal chalcogenide is formed along a sidewall of the recess. Block 1720 may further comprise deposition of a precursor material and conversion of that precursor material into a metal chalcogenide, for example as described elsewhere herein. Methods 1701 complete at block 1725 where a gate stack is formed within the remainder of the recess and then the structure is capped with a second source/drain metallization. If desired, the cap over the gate stack may further include additional metal chalcogenide, for example to increase contact interface with the second source/drain metallization.

Figure 17B:
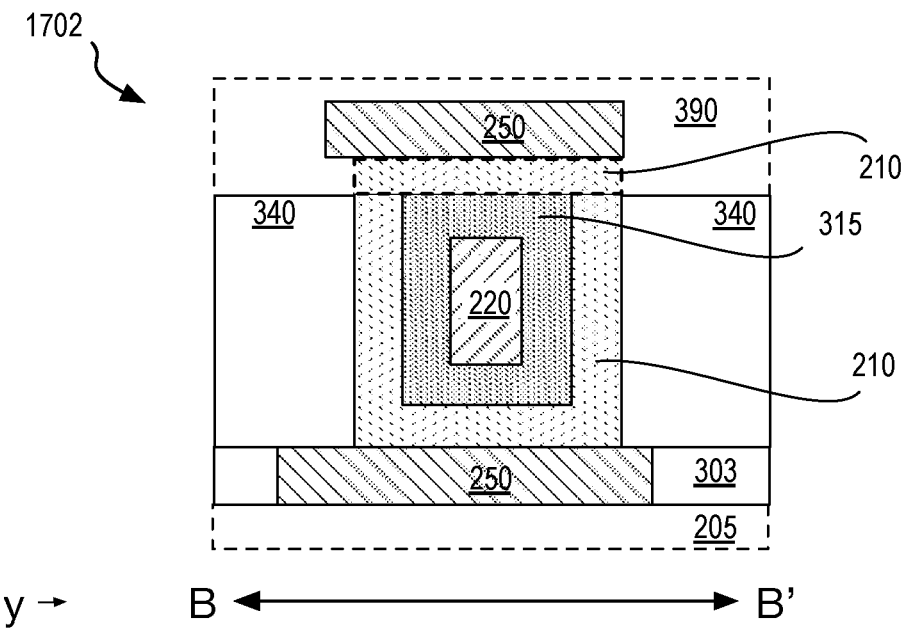
FIG. 17B is a cross sectional view of a transistor structures including a metal chalcogenide channel material along the B-B' line introduced in FIG. 2, in accordance with some embodiments.

FIG. 17B illustrates a transistor structure 1702 that may be fabricated according to methods 1701 (FIG. 17A). As shown in FIG. 17B, transistor structure 1702 includes a first or source/drain metallization 250 (e.g., source metallization) over substrate 205. Dielectric material 340 is over dielectric material 303 and over the first source/drain metallization 250.

A recess (e.g., a trench) extends through dielectric material 340, exposing the source/drain metallization 250. Semiconductor body 210 is along a sidewall of dielectric material 340, for example lining the recess and contacting a bottom of source/drain metallization 250. In some advantageous embodiments, semiconductor body 210 comprises a precursor material (e.g., metallic or metal oxide) that has been converted into a metal chalcogenide.

Transistor structure 1702 further includes gate dielectric 315, which lines an interior sidewall of semiconductor body 210. Gate electrode 220 further occupies an interior of the recess, and is further insulated with gate dielectric 315, or any other dielectric material. Another source/drain metallization 250 (e.g., drain metallization) is in contact with semiconductor body 210 to complete the three transistor terminals. As illustrated in dashed line, additional metal chalcogenide may be over gate dielectric 315, for example to reduce source/drain contact resistance to semiconductor body 210.

Figure 18A:
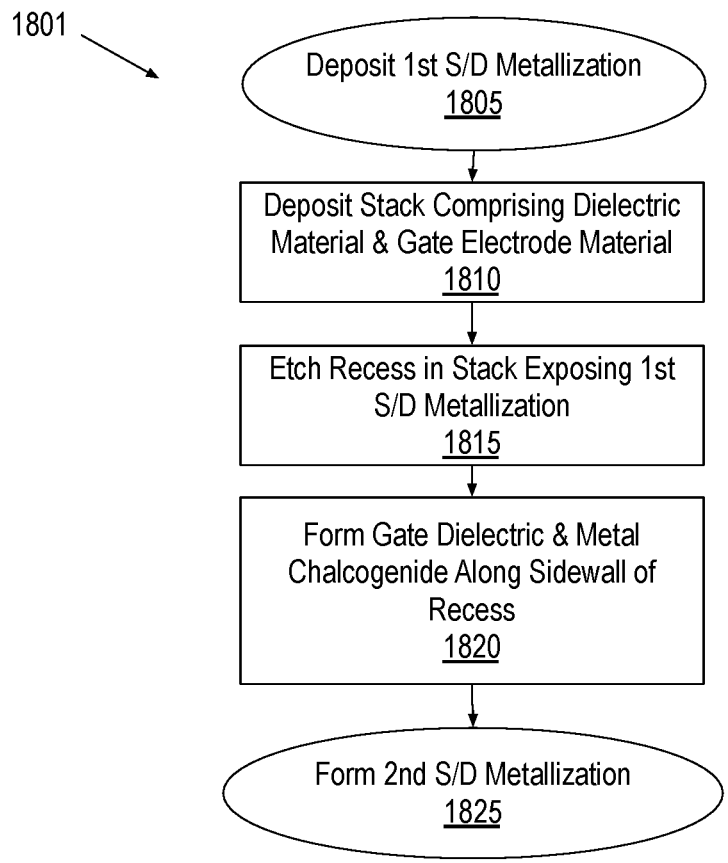
FIG. 18A is a flow diagram illustrating methods of fabricating transistor structures, in accordance with some embodiments.

For other embodiments, source/drain metallization may instead be located within an interior of a non-planar structure, and the gate stack at the exterior of the structure. FIG. 18A illustrates exemplary methods 1801 which begin at block 1805 where a first source/drain metallization is formed over a substrate. At block 1810 a material stack including one or more layers of gate electrode material and one or more layers of any suitable dielectric material is deposited over the first source/drain metallization. A recess (e.g., a trench) is then formed through the material layer stack at block 1815, exposing the first source/drain metallization at a bottom of the recess. Methods 1801 continue at block 1820 where a gate dielectric is then formed over a sidewall of the gate electrode material layer(s) exposed within the recess, and the metal chalcogenide is then formed over the gate dielectric along a sidewall of the recess. The structure is then capped with a second source/drain metallization at block 1825. If desired, the cap may further include additional metal chalcogenide, for example to increase contact interface with the second source/drain metallization.

Figure 18B:
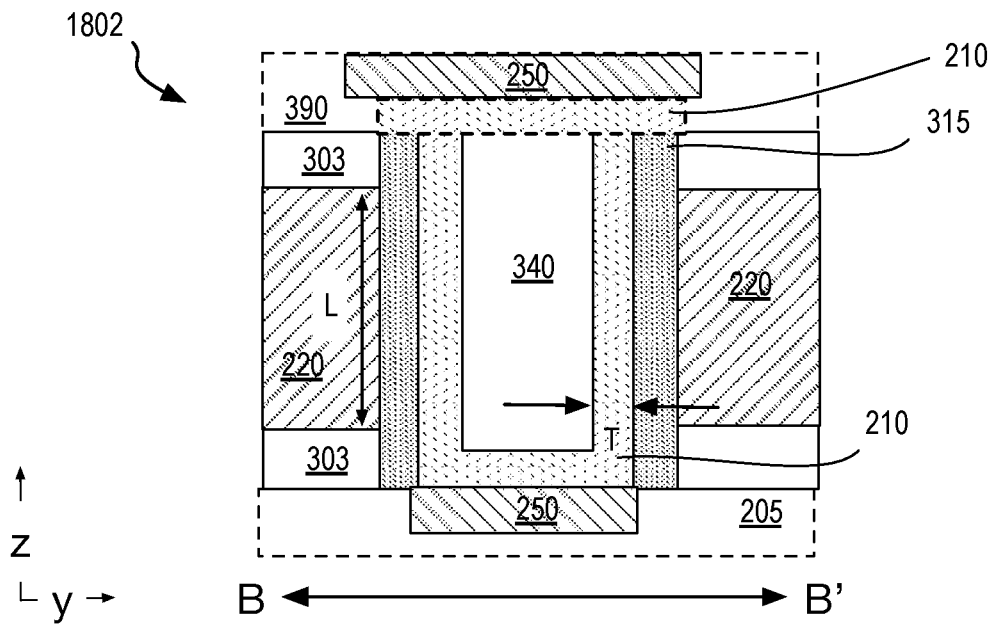
FIG. 18B is a cross sectional view of a transistor structures including a metal chalcogenide channel material along the B-B' line introduced in FIG. 2, in accordance with some embodiments.

FIG. 18B illustrates one exemplary transistor structure 1802, which may be fabricated according to methods 1801 (FIG. 18A), for example. As shown in FIG. 18B, transistor structure 1802 includes top and bottom source and drain metallizations 250 in contact with semiconductor body 210, which spans a vertical (e.g., z) distance between metallization 250. As shown, vertical separation between source and drain metallizations 250 defines a channel length L of transistor structure 1802 having a channel thickness T of a metal chalcogenide semiconductor material.

Although transistor structure 1802 includes only one gate electrode 220, a stack may include any number of layers of gate electrode material. A vertical string of gate controlled semiconductor channels may be employed in a variety of devices, such as an electronic memory device. For example, various vertical NAND-type architectures may be modified to include a metal chalcogenide channel semiconductor, such as one of the compositions described herein, and/or one formed through techniques described herein.

Figure 19A:
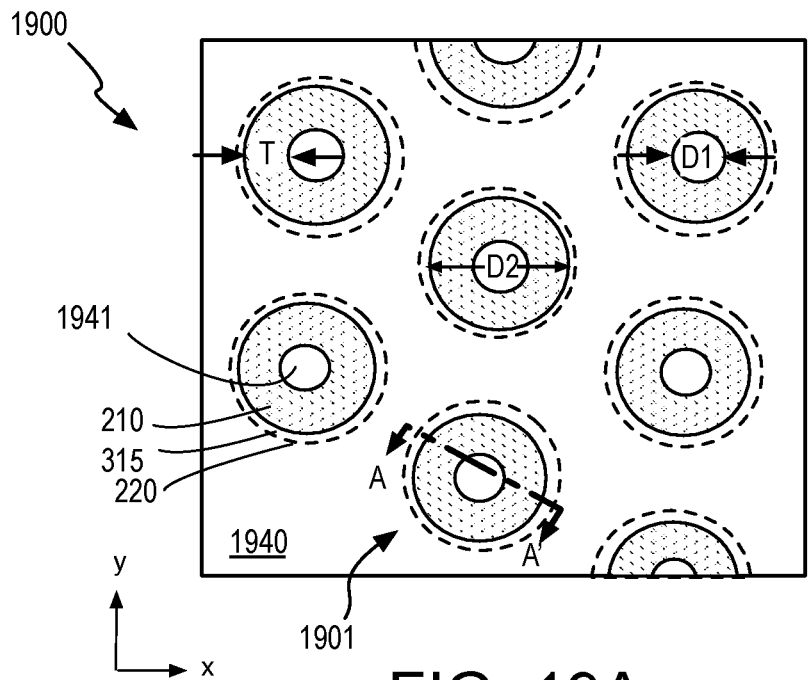
FIG. 19A is a plan view of a memory array portion, in accordance with some embodiments.

A vertical NAND architecture is one example where a stack of gate electrode material layers may each be operable as a control gate electrode in a string comprising many transistor channels. Such structures may be fabricated according to methods 1801, for example. FIG. 19A is a plan view of a vertical thin film transistor array portion 1900, in accordance with some embodiments. Transistor structure array portion 1900 may be one portion of an array that extends over an area of a device layer within an IC die, for example. As shown in solid line, within the plane of a dielectric material 1940, each transistor structure 1901 includes semiconductor body 210 that lines a sidewall of an opening, or via extending through dielectric material 1940. In other embodiments, semiconductor body 210 may lines a sidewall of an elongated trench through dielectric material 1940. Transistor structure 1901 includes additional terminals (not depicted) above and below the plane of gate electrode material 220. During device operation, these transistor terminals are electrically coupled together through semiconductor body 210 as a function of the field effect through gate dielectric material 315 responsive to a gate bias applied to gate electrode material 220. Layers of fate electrode material 220 may each be coupled to a wordline of a NAND memory array. Each semiconductor body 210 may be coupled to a bitline (not depicted), and further coupled to a select transistor (not depicted), for example.

Channel thickness T is less than twice the via diameter D2 so that semiconductor body 210 is a cylindrical structure so that a dielectric material 1941 having a diameter D1 is surrounded by semiconductor body 210. Dielectric materials 1940 and 1941 may have any composition (e.g., silicon dioxide, a low-k material, etc.). Dielectric materials 1940 and 1941 may have the same composition, or not. Below the plane of dielectric material 1940 is a gate dielectric material 315 that is in contact with a sidewall of a gate electrode material 220. In FIG. 2, this interface is illustrated by dashed line. Gate dielectric material 315 is also an annular or cylindrical structure. As shown, sidewall of a gate electrode material 220 is outside of via diameter D2. Gate electrode material 220 may be continuous over a plurality of transistor structures 1901. For example, in FIG. 19A, gate electrode material 220 is continuous over all transistor structures 1901 within array portion 1900. Alternatively, gate electrode material 220 may be further patterned into separate array row/column lines, or into transistor-level independent gate electrodes.

Figure 19B:
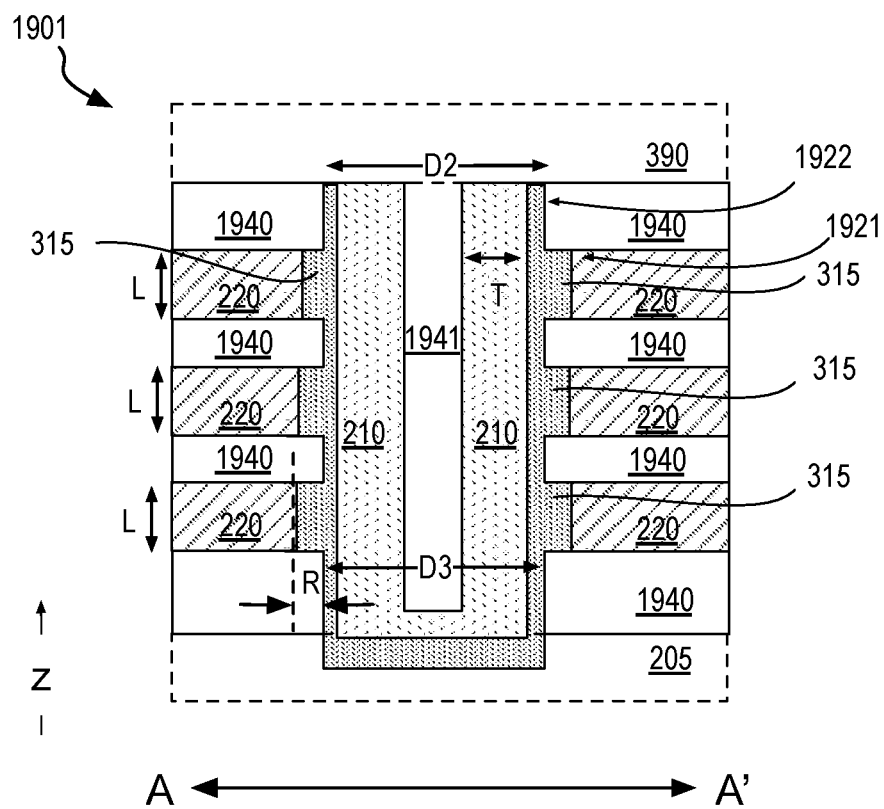
FIG. 19B is a cross-sectional view of a transistor structure including a metal chalcogenide channel material along the A-A' line introduced in FIG. 19A, in accordance with some embodiments.

FIG. 19B is a cross sectional view of vertical thin film transistor structure 1901 along the A-A' line shown in FIG. 19A, in accordance with some embodiments. In FIG. 19B, transistor structure 1901 is again over a substrate 205, which is illustrated in dashed line to emphasize that substrate 205 may include number of underlying gate electrode material levels and/or FEOL circuitry levels. Similarly, any number of additional back-end of line (BEOL) material layers 390 may be over transistor structure 1901. Via diameter D2 may range from ten to a hundred nanometers, for example. In some exemplary embodiments, via diameter D2 is less than 70 nm (e.g., 40 nm, 50 nm, 60 nm, etc.). A lower via diameter D3 may be somewhat smaller than via diameter D2, depending on a sidewall slope, or profile, for example.

Dielectric material layers 1940 may each have any compositions and layer thicknesses. For example, dielectric material layers 1940 may be silicon dioxide, silicon nitride, silicon oxynitride, or any low-k material. In some exemplary embodiments, dielectric material layers 1940 have the same composition. Dielectric material layers 1940 may also have different compositions (e.g., where first alternating layers are silicon dioxide, and second alternating layers are a low-k material, etc.).

Semiconductor body 210 may have any of the compositions described above, for example, as formed according to methods 101, or any may be any other metal chalcogenide. Semiconductor body 210 may have a channel thickness T (as measured in a direction normal to a sidewall of dielectric material layer 1940) that is only a few monolayers (e.g., 5-10 nm). As further illustrated, transistor structure 1901 further includes multiple layers of gate electrode material 220, each layer being separated by a layer of dielectric material 1940. Each layer of gate electrode material 220 has a sidewall 1921 that is recessed from dielectric material sidewall 1922 by a recess radial distance R. Radial distance R may vary from a few nanometers to tens of nanometers. In some examples, radial distance R is between 5 nm and 15 nm (e.g., 10 nm).

Gate dielectric material 315 at least partially occupies the recess of radial distance R. While gate dielectric material 315 ma be any suitable material, such as any of those examples described above, for an Fe-NAND embodiment, gate dielectric material 315 is a ferroelectric material. Many high-k dielectric materials are ferroelectrics when crystal texture is of a particular phase. Dopants may be added to the gate dielectric material to promote such a ferroelectric crystal phase. Silicon is one example of ferroelectric phase promoting/stabilizing dopant for HfOX gate dielectric embodiments. In Fe (ferroelectric) FET (field effect transistor) embodiments, gate dielectric material 315 has a permanent dipole. As a result, the threshold voltage ($V_t$) of each FeFET can vary between multiple states (e.g., $V_{t,\,high}$ and $V_{t,\,low}$) as a function of the dipole state of the gate dielectric. A bit value may be assigned to a particular one of the threshold voltage levels, and read out accordingly. In some embodiments, gate dielectric material 315 is a cylindrical structure between the semiconductor material and a sidewall of gate electrode material layer 220. In the illustrated example, gate dielectric material 315 is in direct contact with gate electrode material sidewall 1921, and gate dielectric material 315 has a thickness substantially equal to radial distance R so that a semiconductor channel interface between semiconductor body 210 and gate electrode material 315 is substantially equal to via diameter D2. While gate dielectric material 315 is shown as also being present between semiconductor body 210 and dielectric material sidewall 1922, gate dielectric material 315 may also be localized to between gate electrode material 220 and semiconductor body 210 within channel portion(s) of transistor structure 1901.

Although individual transistor structures are described, any number of such structures may be fabricated concurrently. Within any plurality of such transistor structures, individual ones of the plurality may include a channel region comprising a substantially monocrystalline or textured polycrystalline metal chalcogenide. However, across the plurality there may be differences in the orientations of the metal chalcogenide crystals or texture. In some embodiments, for example, the in-plane orientation of the metal chalcogenide crystals may vary randomly. In some such embodiments, no more than two adjacent transistor structures have the same crystal orientation. This characteristic may result from a seeded conversion of a precursor material into the semiconducting metal chalcogenide, for example as described above in the context of methods 101 (FIG. 1). For such seeded conversion embodiments, different crystal orientations may be associated with the different seed structures.

Figure 20A:
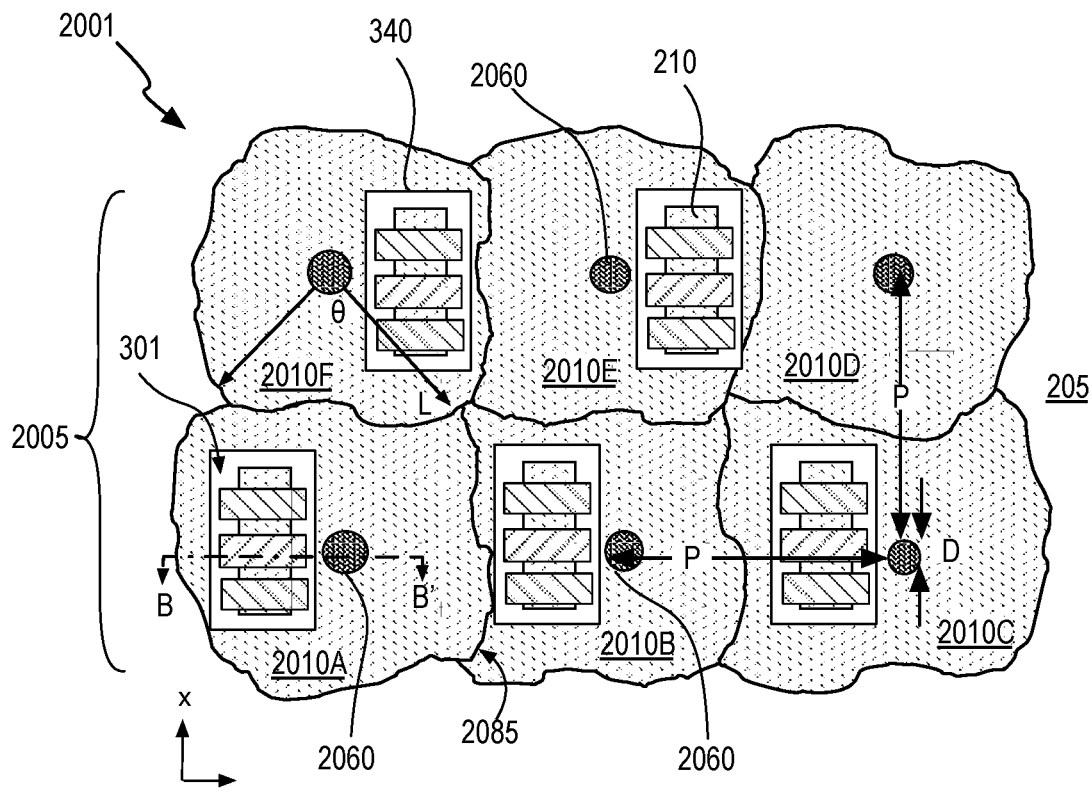
FIGS. 20A and 20B are plan views of a plurality of transistor structures, each including a metal chalcogenide channel material, in accordance with some embodiments.

FIG. 20A illustrates a plan view of a device level in an IC structure 2001, in accordance with some embodiments. The B-B' line shown in FIG. 20A demarks the sectional view further illustrated in FIG. 21. As shown in FIG. 20A, seed structure 2060 has a minimum lateral dimension (e.g., diameter) D. The minimum lateral seed dimension D may be defined by an etch process, or other technique employed to pattern seed structure 2060. Although minimum lateral seed dimension D may vary, lateral seed dimension D may be defined so as to limit the number of grains present within seed structure 2060, for example to not exceed some threshold (e.g., 1 or 2 grains, etc.). In some embodiments, D is less than 100 nm, and advantageously less than 30 nm (e.g., 10-20 nm). Minimum lateral seed dimension D is illustrated as being approximately the same in both x and y dimensions, which may advantageously minimize a number of grains within seed structure 2060. However, lateral seed dimensions may exceed the minimum lateral seed dimension D in one dimension, for example where seed structure 2060 is elongated.

For embodiments where grains within a seed material are equal to, or larger, than a minimum lateral seed dimension D), only a few (e.g., 1-3) grains are likely to be present within a seed structure 2060. As such there may be few, if any, grain boundaries present within an area of seed structure 2060. These few grains may then be associated with crystallinity of metal chalcogenide semiconductor material 2010 emanating from seed structure 2060 over an azimuthal angle θ about a perimeter of seed structure 2060 (e.g., within the illustrated x-y plane). In the example illustrate in FIG. 20A, seed structure 2060 is single crystalline such that metal chalcogenide semiconductor material 2010 comprises an epitaxial crystal spanning a 360° azimuthal angle θ about seed structure 2060 and extending some lateral crystal length L from seed structure 2060.

Multiple seed structures may be present within a single device layer, particularly where lateral crystal length L is smaller than a footprint of circuitry. In the example shown in FIG. 20A, a plurality of seed structures 2060 is arrayed over an area of substrate 205. In this example, seed structures 2060 have a fixed lateral grid pitch P, which may be predetermined to form intersecting crystals based on a predetermined lateral crystallization rate for metal chalcogenide semiconductor material 2010. Although seed grid pitch P may vary, in some embodiments where minimum seed dimension D is less than a hundred nanometers, seed grid pitch P is at least a micrometer, and may be 10 µm, or more.

In some embodiments, where seed structures are independent of any shared crystal reference, such as a semiconductor layer within substrate 205, metal chalcogenide semiconductor material around each seed may have different crystallinity that is associated with one particular seed structure. For example, where seed structures 2060 have crystallinity independent of each other, a plurality of crystalline zones 2010A, 2010B, 2010C, 2010D, 2010E, 2010F are present, with one zone being around each of the plurality of seed structures 2060. In some embodiments there is a single crystal within each crystalline zone 2010A-2010F. In such single crystalline embodiments, there may be only one grain boundary 2085 at the interface of two adjacent crystalline zones (e.g., 2010A and 2010B). In some embodiments, grain boundary 2085 is a small angle grain boundary (e.g., crystal orientation within zone 2010A nearly matches crystal orientation within zone 2010B). In other embodiments, metal chalcogenide semiconductor material 2010 within each crystalline zone 2010A-2010F is polycrystalline with texture that is associated with an associated one of the plurality of seed structures 2060. In such polycrystalline embodiments, many more grain boundaries (not depicted) may be present, and grain boundary 2085 is then a boundary where crystal texture may transition from a first texture in zone 2010A that is associated with a first seed structure 2060, to a second texture in zone 2010B that is associated with a second seed structure 2060.

Within a device layer, a plurality of active devices 2005 may include metal chalcogenide semiconductor material of a given crystallinity. While not all transistor structures may have exactly the same crystallinity, each of transistor structures may nevertheless display superior performance associated with a higher quality (more crystalline) semiconductor material. As further shown in FIG. 20A, for example, one transistor structure 301 is adjacent to one seed structure 2060. In the plan view, each transistor structure 301 occupies a portion of a given crystal zone 2010A-2010F with the transistor pitch also being P. In other embodiments, two or three transistor structures may be present within a single crystalline zone having a sufficient lateral crystal length L. As such, within a crystalline zone (e.g., 2010A) all transistor structures will have the same crystal orientation, or same crystalline texture). Within another crystalline zone (e.g., 2010B), all transistor structures will again all have metal chalcogenide semiconductor material with the same crystal orientation, or same crystalline texture), which may be randomly different than of crystalline zone 2010A.

In some embodiments, dielectric material separates metal chalcogenide semiconductor material into separate devices and/or islands. This dielectric material may function as electrical isolation between two adjacent transistor structures. In the example shown in FIG. 20A, dielectric material 340 surrounds, or is a perimeter about a transistor structure 301. In the plan view shown, within one crystal zone (e.g., 2010A) metal chalcogenide semiconductor body 210 is surrounded by a frame of dielectric material 340 and has the same crystallinity as that of metal chalcogenide semiconductor material 2010 outside of the frame of dielectric material 340.

Figure 20B:
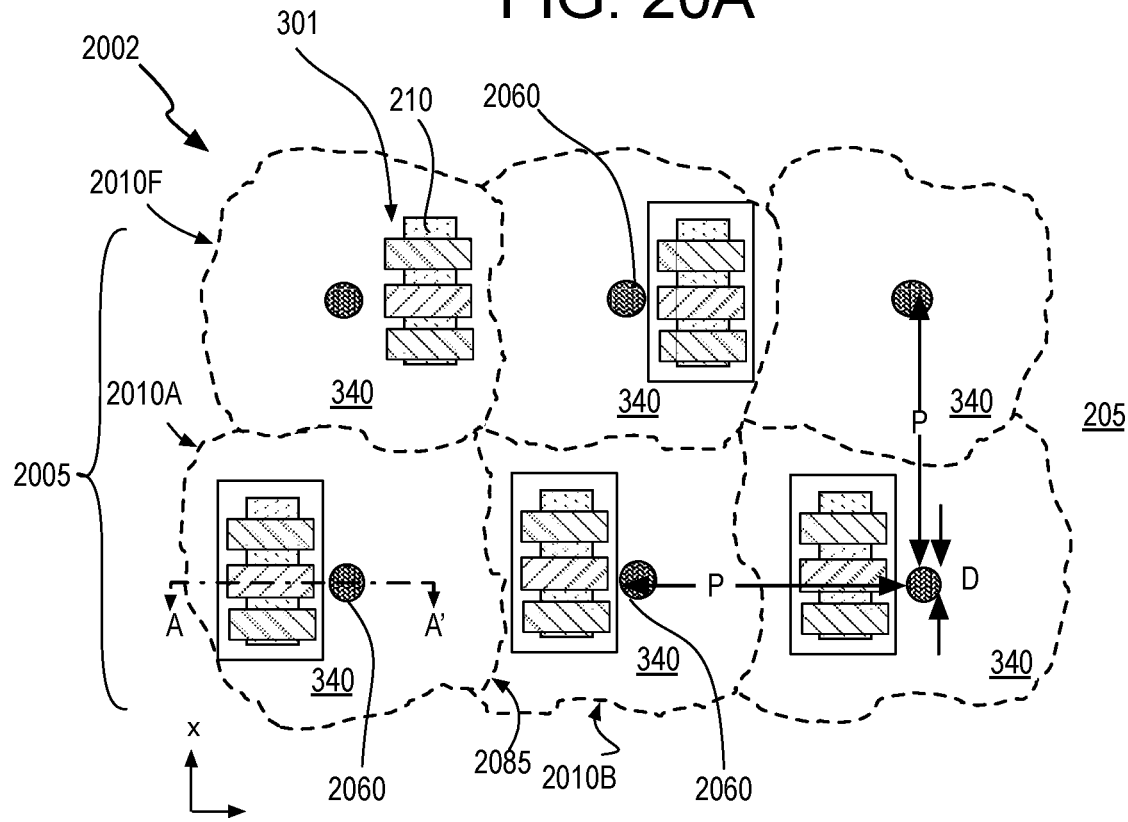

FIG. 20B illustrates a plan view of a device level in an IC structure 2002, in accordance with some alternative embodiments where only a small portion of metal chalcogenide semiconductor material is retained as semiconductor bodies 210. The crystalline association between semiconductor bodies 210 and proximal seeds structures 2060 may still be evident even with more significant patterning of the metal chalcogenide semiconductor material. Dashed line in FIG. 20B illustrates a former grain boundary 2085 between two neighboring crystal zones (e.g., 2010A and 2010B). Although grain boundary 2085 is not directly evident following the more extensive patterning of the metal chalcogenide semiconductor material, crystallinity of semiconductor bodies 210 within various ones of the transistor structures 301 is nevertheless still associated with the nearest seed structure 2060. The former location of grain boundary 2085 may even be approximated down to less than the pitch of transistor structures 301 through a spatial crystallinity analysis that maps the crystallinity of the metal chalcogenide semiconductor material.

The various transistor structures and techniques described above are applicable to active devices for any IC architecture. In some particularly advantageous embodiments however, the transistor structures and techniques described above are employed within a 3D IC having more than one device level. In some embodiments, any the transistor structures and techniques described above are iterated to generate two, three, or more levels of transistors, which may all be interconnect with inter-level metallization. In some other embodiments, any of the transistor structures and techniques described above are employed at least one to fabricate a back-end device level over a front-end device level. That front-end device level may comprise any suitable CMOS circuitry that may include transistors utilizing a Group IV semiconductor channel material, such as silicon, germanium, or SiGe alloys. Such front-end transistors may have single crystalline channel regions that employ a portion of a single crystalline substrate, for example.

Figure 21:
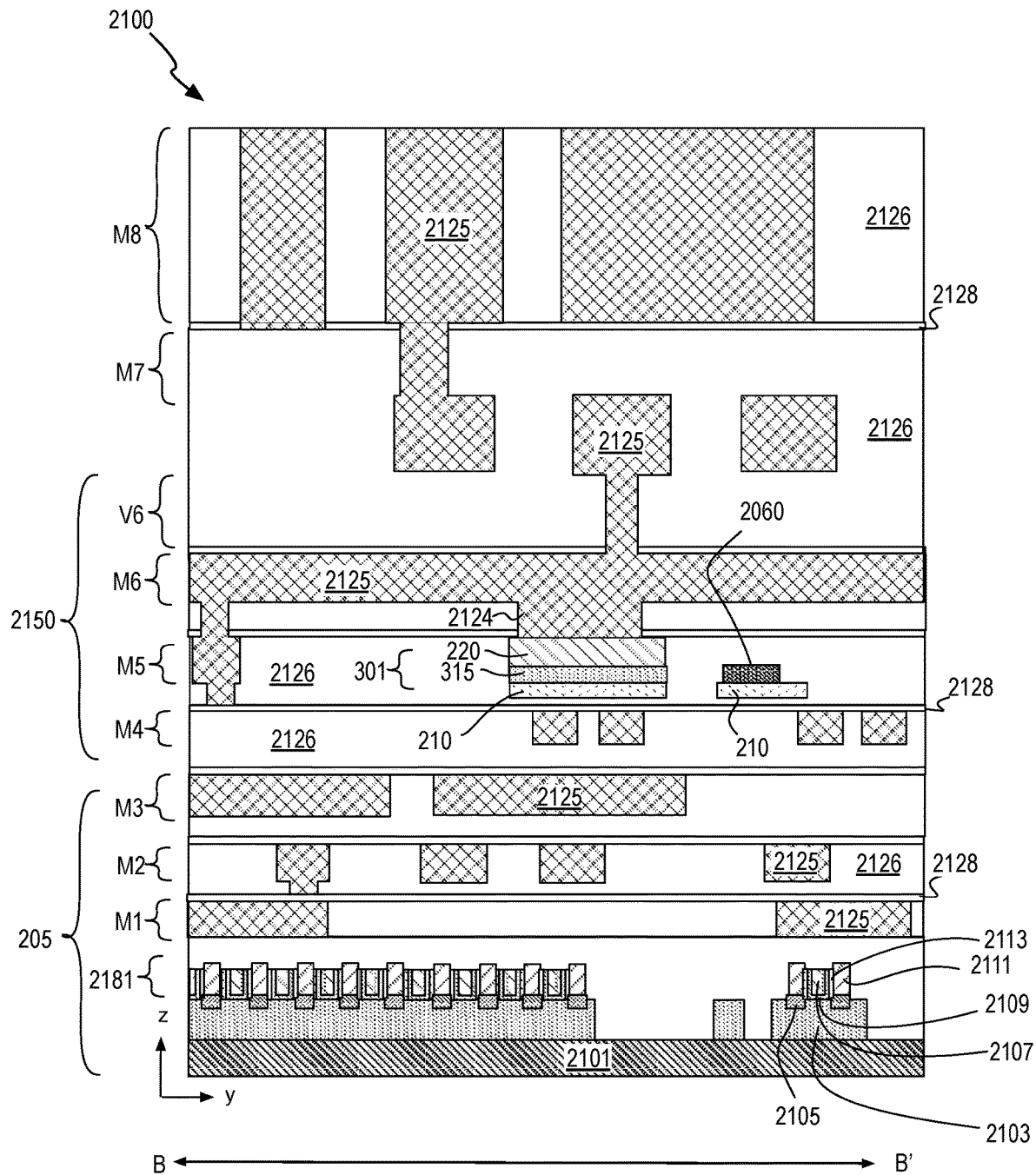
FIG. 21 illustrates a cross-sectional view of a 3DIC structure including metal chalcogenide transistor circuitry over CMOS FET circuitry, in accordance with some embodiments.

FIG. 21 illustrates a cross-sectional side view of a 3D IC structure 2100, in accordance with some embodiments. Structure 2100 illustrates a portion of a monolithic IC that includes a substrate 205 that comprises FEOL device circuitry fabricated over and/or on a single crystalline substrate 2101. In this example, FEOL device circuitry includes a plurality of MOSFETs 2181 that employ a monocrystalline semiconductor material 2103 for at least a channel region of each transistor. In other embodiments, FEOL device circuitry includes other types of transistors (e.g., bipolar junction transistor, etc.), or other active devices employing one or more semiconductor materials (e.g., diodes, lasers, etc.). FETs 2181 include a gate terminal 2107 separated from a semiconductor material 2103 by a gate dielectric 2109. The channel region of semiconductor material 2103 separates semiconductor terminals 2105 (source semiconductor and drain semiconductor). Contact metallization 2111 is in contact with semiconductor terminals 2105 and is separated from gate terminal 2109 by an intervening dielectric spacer 2113. Any materials known to be suitable for FETs may be present in FEOL FETs 2181. FETs 2181 may be planar or non-planar devices. In some advantageous embodiments, FETS 2181 are finFETs. FETs 2181 may include one or more semiconductor materials. As one example, semiconductor material 2103 is a surface layer of a substantially monocrystalline substrate 2101. Substrate 2101 may be any material known to be suitable for the fabrication of MOSFET (CMOS) circuitry, such as, but not limited to, group IV materials (e.g., substantially pure silicon, substantially pure germanium, and SiGe alloys that may range from predominantly Si to predominantly Ge).

FEOL device circuitry may further include one or more levels of interconnect metallization 2125 electrically insulated by dielectric materials 2126, 2128. In the exemplary embodiment illustrated, FEOL device circuitry includes metal-one (M1), metal-two (M2) and metal-three (M3) interconnect metallization levels. Interconnect metallization 2125 may be any metal(s) suitable for FEOL and/or BEOL IC interconnection. Interconnect metallization 2125, may be, for example, an alloy of predominantly Cu, an alloy of predominantly W, or an alloy of predominantly Al, etc. Dielectric material 2126 may be any dielectric material known to be suitable for electrical isolation of monolithic ICs. In some embodiments, dielectric material 2126 comprises silicon, and at least one of oxygen and nitrogen. Dielectric material 2126 may be SiO, SiN, or SiON, for example. Dielectric material 2126 may also be a low-K dielectric material (e.g., having a dielectric constant below that of $SiO_2$). Dielectric material 2128 has a different composition that dielectric material 2126, and may be of a composition that has a higher dielectric constant than that of dielectric material 2126. In some examples where dielectric material 2126 is predominantly silicon and oxygen (i.e., $SiO_x$), dielectric material 2128 is predominantly silicon and nitrogen (i.e., $SiN_x$).

BEOL device circuitry is located over the FEOL device circuitry, with dielectric material 2126 therebetween. BEOL device circuitry includes a plurality of devices 2150 that employ semiconductor body 210 comprising a metal chalcogenide for at least a channel region of each transistor. In other embodiments, BEOL device circuitry includes other types of transistors (e.g., bipolar junction transistor, etc.), or other active devices (e.g., diodes, lasers, etc.) employing one or more metal chalcogenide semiconductor material. For the illustrated embodiments, individual ones of devices 2150 include gate electrode 220 separated from a channel region of semiconductor body 210 by gate dielectric 315. In the exemplary embodiment illustrated, transistor structures 301 are "top-gate" devices with gate electrode 220 over semiconductor body 210. Although top-gate devices are illustrated, embodiments herein are also applicable bottom-gate transistor architectures, side-gate transistor architectures, or other planar and non-planar transistor architectures, such as any of those described elsewhere herein.

BEOL circuitry may comprise any number of metallization levels over transistor structures 301, such as a metallization level (e.g., M6) immediately above the metallization level (e.g., M5) in which transistor structures 301 reside. As further shown, a via 2124 electrically connects interconnect metallization levels to gate electrode 220. Any number of interconnect metallization levels may be employed to couple BEOL circuitry to the underlying FEOL device circuitry. In the example shown in FIG. 21, metallization levels of BEOL circuitry (e.g., M8) may be routed down through any number of metallization levels (e.g., M8-M3) to be in electrical communication with one or more FEOL transistors 2181.

In some embodiments, a device level within BEOL circuitry further includes a seed structure. The seed structure comprises a crystalline material including one or more grains that impart a suitable long-range order to the microstructure of metal chalcogenide of semiconductor body 210. In the example shown in FIG. 21, seed structure 2060 is laterally adjacent to transistor structure 301 (i.e., within a same BEOL level) and metal chalcogenide semiconductor body 210 has microstructure associated with that of seed structure 2060. As shown, some metal chalcogenide semiconductor material 210 external of transistor structure 301 is in direct contact with a bottom surface of seed structure 2060. Dielectric material (e.g., dielectric material 2126) may completely separate seed structure 2060 from adjacent semiconductor body 210, for example as a result of BEOL processing that electrically isolates transistor structure 301.

In some embodiments, one or more dielectric materials may separate a seed structure from an underlying FEOL device level and/or underlying crystalline substrate. For such examples, crystallinity of the seed structure may be completely independent of a semiconductor substrate. In the embodiment illustrated in FIG. 21, seed structure 2060 is separated from crystalline substrate 2101 by at least dielectric material 2126. Seed structure 2060 may therefore have any crystallinity, for example as may be defined through a deposition and/or anneal of seed material.

Seed structure 2060 may comprise any material known to be crystalline when deposited and/or annealed. In some such embodiments, seed structure 2060 comprises a metal. In some specific examples, seed structure 2060 comprises at least one d-block or p-block metal. In some further embodiments, seed structure 2060 comprises predominantly a metal and nitrogen (e.g., TiN, AlN, TiAlN, etc.). Although seed structure 2060 may advantageously be single crystalline, seed structure 2060 may include more than one crystal grain. For such polycrystalline embodiments however, individual grains of seed structure 2060 advantageously occupy an entire channel thickness T of seed structure 2060. In other words, at least a sidewall of seed structure 2060 over some lateral dimension is single crystalline. Seed thickness may vary, but in some examples is less than 100 nm, and may be 25-75 nm for example.

In further embodiments, there may be multiple levels of BEOL device circuitry located over the FEOL device circuitry, each with dielectric material 2126 therebetween. Each level of BEOL device circuitry may include a plurality of devices 2150 that employ semiconductor body 210 comprising a metal chalcogenide for at least a channel region of each transistor.

In other embodiments, a 3DIC may include one or more levels of the BEOL device circuitry without any monocrystalline FEOL transistors. For such embodiments, the BEOL devices may be over any substrate (e.g., polymer, glass, etc.). Hence, transistors with metal chalcogenide channels may be employed in conjunction with monocrystalline channeled devices, or not.

Figure 22:
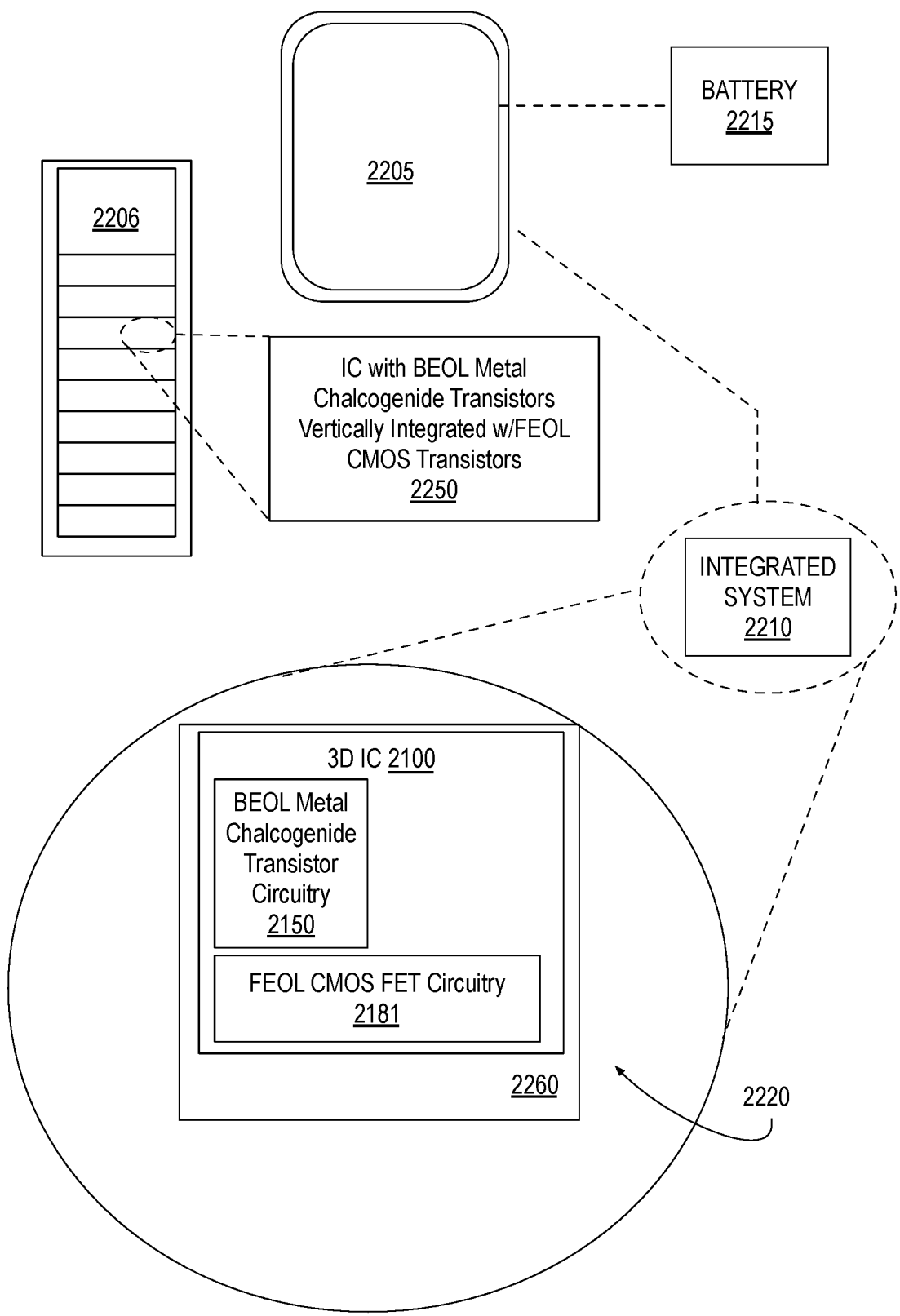
FIG. 22 illustrates a system employing an IC including metal chalcogenide transistor circuitry over CMOS FET circuitry, in accordance with some embodiments.

FIG. 22 illustrates a system in which a mobile computing platform 2205 and/or a data server machine 2206 employs an IC including at least one back-end metal chalcogenide semiconductor device, which may be over a front-end semiconductor device, in accordance with some embodiments. The server machine 2206 may be any commercial server, for example including any number of high-performance computing platforms disposed within a rack and networked together for electronic data processing, which in the exemplary embodiment includes a packaged monolithic IC 2250. The mobile computing platform 2205 may be any portable device configured for each of electronic data display, electronic data processing, wireless electronic data transmission, or the like. For example, the mobile computing platform 2205 may be any of a tablet, a smart phone, laptop computer, etc., and may include a display screen (e.g., a capacitive, inductive, resistive, or optical touchscreen), a chip-level or package-level integrated system 2210, and a battery 2215.

Whether disposed within the integrated system 2210 illustrated in the expanded view 2220, or as a stand-alone packaged chip within the server machine 2206, packaged monolithic 3D IC 2150 includes a memory chip (e.g., RAM), or a processor chip (e.g., a microprocessor, a multi-core microprocessor, graphics processor, or the like) including at least one metal chalcogenide semiconductor device, for example as describe elsewhere herein. 3D IC 2100 may further include silicon CMOS front-end circuitry 2181. The 3D IC 2100 may be further coupled to a board, a substrate, or an interposer 2260.

3D IC 2100 may have an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 2250 or within a single IC coupled to the package substrate of the monolithic IC 2250.

Figure 23:
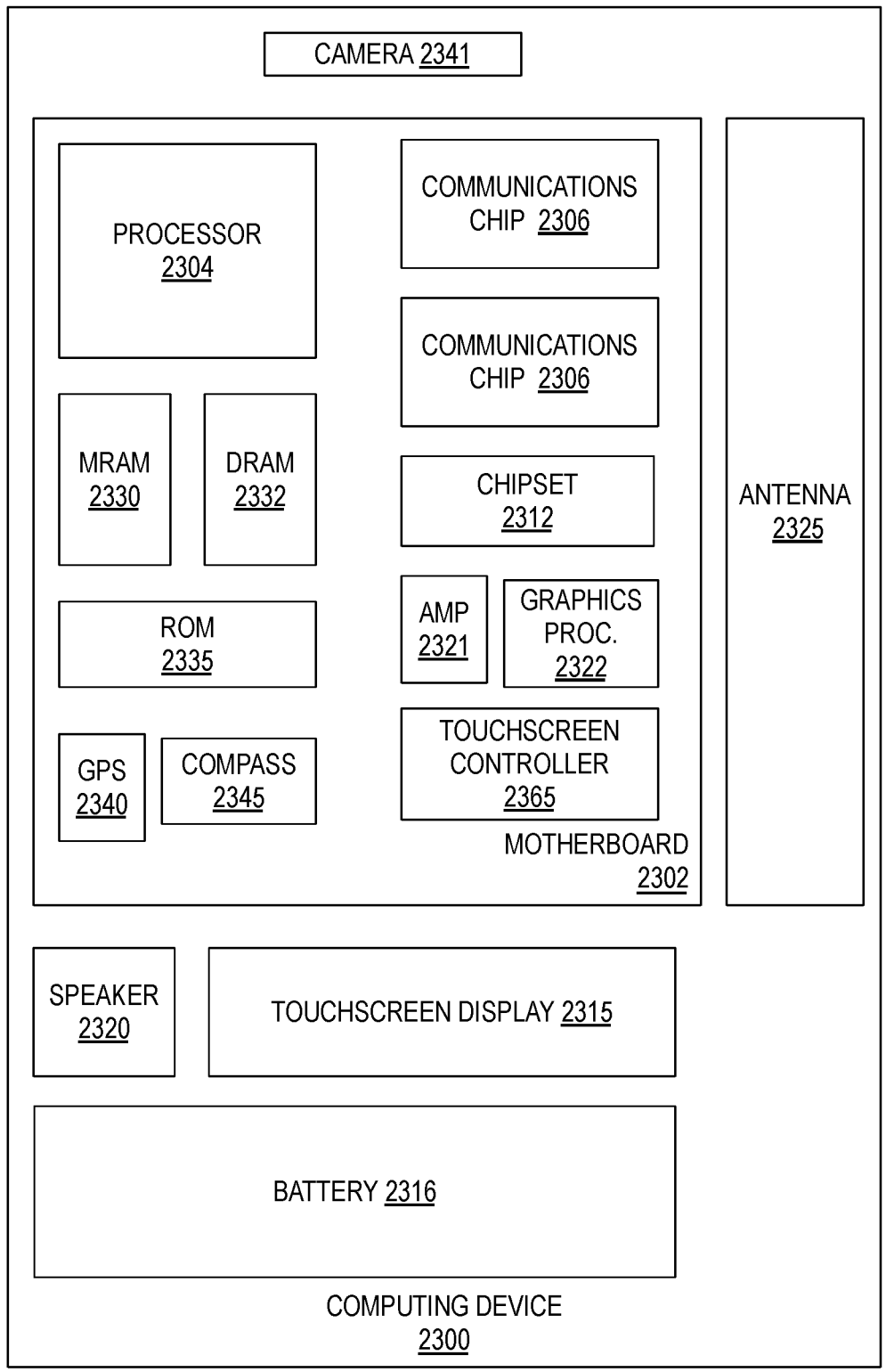
FIG. 23 is a functional block diagram illustrating an electronic computing device, in accordance with an embodiment of the present invention.

FIG. 23 is a functional block diagram of an electronic computing device 2300, in accordance with some embodiments. Device 2300 further includes a motherboard 2302 hosting a number of components, such as, but not limited to, a processor 2304 (e.g., an applications processor). Processor 2304 may be physically and/or electrically coupled to motherboard 2302. In some examples, processor 2304 includes a 3D IC structure, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 2306 may also be physically and/or electrically coupled to the motherboard 2302. In further implementations, communication chips 2306 may be part of processor 2304. Depending on its applications, computing device 2300 may include other components that may or may not be physically and electrically coupled to motherboard 2302. These other components include, but are not limited to, volatile memory (e.g., DRAM 2332), non-volatile memory (e.g., ROM 2335), flash memory (e.g., NAND or NOR), magnetic memory (MRAM 2330), a graphics processor 2322, a digital signal processor, a crypto processor, a chipset 2312, an antenna 2325, touchscreen display 2315, touchscreen controller 2365, battery 2316, audio codec, video codec, power amplifier 2321, global positioning system (GPS) device 2340, compass 2345, accelerometer, gyroscope, speaker 2320, camera 2341, and mass storage device (such as hard disk drive, solid-state drive (SSD), compact disk (CD), digital versatile disk (DVD), and so forth), or the like. In some exemplary embodiments, at least one of the functional blocks noted above comprise an IC including a transistor structure with a back-side contact metallization to deep source and/or drain semiconductor for example as described elsewhere herein.

Communication chips 2306 may enable wireless communications for the transfer of data to and from the computing device 2300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2306 may implement any of a number of wireless standards or protocols, including but not limited to those described elsewhere herein. As discussed, computing device 2300 may include a plurality of communication chips 2306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In first examples, a transistor structure, comprises a chalcogenide comprising one or more p-block metals, a source contact metal and a drain contact metal, with at least the chalcogenide therebetween, and a gate electrode material separated from the first material by at least a gate dielectric material.

In second examples, for any of the first examples the chalcogenide is a compound with composition $MC_x$, wherein M comprises one or more Group III or Group V elements, C is Se or S, and x is between 0.2 and 4.

In third examples, for any of the second examples, M further comprises a transition metal.

In fourth examples, for any of the third examples the transition metal is Zn.

In fifth examples, for any of the second through fourth examples, M comprises $In_y$, $Ga_z$, and $Zn_{1-y-z}$ and wherein y and z are both greater than 0, but sum to less than 1.

In sixth examples, for any of the second through fifth examples, the gate dielectric comprises predominantly oxygen and M.

In seventh examples for any of the sixth examples M comprises Ga or W.

In eighth examples, for any of the first through fifth examples the first material has a thickness less than 10 nm, and the source contact metal is separated from a drain contact metal by a channel length of the first material, the channel length exceeding the thickness.

In ninth examples, for any of the first through eighth examples the transistor structure further comprise a second material in contact with the first material, wherein the second material comprises oxygen, and the one or more p-block metals.

In tenth examples, an integrated circuit (IC) die, comprises a plurality of complementary metal-oxide-semiconductor (CMOS) field effect transistor (FET) structures, wherein individual ones of the CMOS FET structures comprise a Group IV semiconductor material, and a plurality of back-end transistor structures over the CMOS FET structures, with one or more levels of interconnect metallization therebetween, wherein individual ones of the back-end transistor structures comprise the transistor structure of any of the first through ninth examples.

In eleventh examples, a transistor structure, comprises a first semiconductor material comprising one or more d-block or p-block metals, and a second semiconductor material in contact with the first semiconductor material, wherein at least the second semiconductor material comprises a chalcogen, and one or more d-block or p-block metals. The structure further comprises a source contact metal and a drain contact metal, with both the first and the second semiconductor materials therebetween, and a gate electrode material separated from the second material by at least a gate dielectric material.

In twelfth examples, for any of the eleventh examples the first semiconductor material further comprises oxygen, the first and second semiconductor materials both comprise the same one or more metals, and the source contact metal is electrically coupled to the drain contact metal by both the first and second semiconductor materials.

In thirteenth examples, for any of the eleventh through twelfth examples the first semiconductor material further comprises a chalcogen, and the first and second semiconductor materials comprise different metals.

In fourteenth examples, for any of the eleventh through thirteenth examples, the first semiconductor material has a first conductivity type and the second semiconductor material has a second conductivity type, complementary to the first conductivity type.

In fifteenth examples, for any of the eleventh through fourteenth examples the first and second semiconductor materials comprise at least one of Zn, Cd, Al, Sn, Ga, In, P, As, or Sb.

In sixteenth examples, for any of the eleventh through fourteenth examples, the chalcogenide comprises S or Se, and x is between 0.2 and 4.

In seventeenth examples, for any of the eleventh through sixteenth examples, the first material is over a substrate dielectric material, the second material is over the first material, the gate dielectric material is over the second material, and the gate electrode material is over the gate dielectric material.

In eighteenth examples, for any of the eleventh through seventeenth examples, a non-planar body comprises the substrate dielectric material. The first and second materials, the gate dielectric material, and the gate electrode material are adjacent to a sidewall of the non-planar body.

In nineteenth examples, an integrated circuit (IC) die, comprises a plurality of complementary metal-oxide-semiconductor (CMOS) field effect transistor (FET) structures, wherein individual ones of the CMOS FET structures comprise a Group IV semiconductor material. The IC die further comprises plurality of back-end transistor structures over the CMOS FET structures, with one or more levels of interconnect metallization therebetween, wherein individual ones of the back-end transistor structures comprise the transistor structure in any of the eleventh through eighteenth examples.

In twentieth examples, a transistor structure comprises a material stack comprising a source contact metal, a drain contact metal, and an intervening dielectric material therebetween. The structure comprises a channel material adjacent to a sidewall of the material stack, wherein the channel material comprises $MS_x$, $MSe_x$, or $MTe_x$, wherein M comprises at least one of Cu, Zn, Cd, Ni, Co, Pd, Pt, Ti, Cr, V, W Mo, Al, Sn, Ga, In, P, As, or Sb. The structure further comprises a gate electrode material adjacent to the channel material, with a gate dielectric material therebetween.

In twenty-first examples, for any of the twentieth examples M comprises at least one of Zn, Cd, Al, Sn, Ga, In, P, As, or Sb, and the gate dielectric material comprises a metal and oxygen.

In twenty-second examples, an integrated circuit (IC) device comprises a plurality of complementary metal-oxide-semiconductor (CMOS) field effect transistor (FET) structures, wherein individual ones of the CMOS FET structures comprise a Group IV semiconductor material. The IC device further comprises a plurality of back-end transistor structures over the CMOS FET structures, with one or more levels of interconnect metallization therebetween, wherein individual ones of the back-end transistor structures comprise the transistor structure in any of the twentieth through twenty-first examples.

In twenty-third examples, a transistor structure comprises a gate electrode material, a gate dielectric material over the gate electrode material, wherein the gate dielectric material comprises oxygen and one or more elements M, and a channel material over the gate dielectric material, wherein the channel material comprises a chalcogen and at least one of the one or more elements M. The structure further comprises a source contact metal and a drain contact metal coupled to the channel material.

In twenty-fourth examples, for any of the twenty-third examples the one or more elements M comprise Ga or W, and the chalcogen comprises at least one of Se and S.

In twenty-fifth examples, for any of the twenty-third through twenty-fourth examples the gate electrode material is over a first of the source contact metal and the drain contact metal, with the a dielectric material therebetween. The gate dielectric material is adjacent a sidewall of the gate electrode material. The channel material is adjacent to the gate dielectric material that is adjacent to the sidewall of the gate electrode material. A second of the source contact metal and the drain contact metal is in contact with the channel material, and over the gate electrode material.

In twenty-sixth examples, an integrated circuit (IC) device comprises a plurality of complementary metal-oxide-semiconductor (CMOS) field effect transistor (FET) structures, wherein individual ones of the CMOS FET structures comprise a Group IV semiconductor material, and a plurality of back-end transistor structures over the CMOS FET structures, with one or more levels of interconnect metallization therebetween. Individual ones of the back-end transistor structures comprise the transistor structure of any of the twenty-third through twenty-fourth examples.

In twenty-seventh examples, an integrated circuit (IC) device comprises an array of transistor structures over a substrate. Individual ones of the transistor structures comprise a monocrystalline chalcogenide comprising one or more p-block or d-block elements, a source contact metal and a drain contact metal, with at least the chalcogenide therebetween, and a gate electrode material separated from the chalcogenide by at least a gate dielectric material. The transistor structures have a predetermined pitch within the array, and relative to a plane of the substrate, a crystal orientation of the metal chalcogenide varies randomly with no more than two adjacent transistor structures having the same crystal orientation.

In twenty-eighth examples, for any of the twenty-seventh examples the chalcogenide is a compound with composition $MC_x$, wherein M comprises a p-block element, C is Se or S, and x is between 0.2 and 4.

In twenty-ninth examples, for any of the twenty-seventh through twenty-eighth examples the substrate comprises a plurality of complementary metal-oxide-semiconductor (CMOS) field effect transistor (FET) structures, and wherein individual ones of the CMOS FET structures comprise a Group IV semiconductor material.

In thirtieth examples, a vertical flash memory structure comprises a material stack comprising a plurality of gate electrode material layers, each gate electrode material layer separated from another by a dielectric material layer. The structure comprises gate dielectric material in direct contact with a sidewall of individual ones of the gate electrode material layers. The structure comprises a channel material in direct contact with the gate dielectric material, wherein the channel material comprises a chalcogenide comprising one or more p-block or d-block elements. The structure comprises first and second terminal contacts coupled to the channel material.

In thirty-first examples, for any of the thirtieth examples the chalcogenide comprises one or more p-block metals.

In thirty-second examples, for any of the thirtieth through thirty-first examples the chalcogenide is a compound with composition $MC_x$, wherein M comprises one or more Group III or Group V elements, C is a Se or S, and x is between 0.2 and 4.

In thirty-third examples, for any of the thirtieth through thirty-second examples the gate dielectric material comprises a ferroelectric material.

In thirty-fourth examples, for any of the thirtieth through thirty-third examples the semiconductor material layer has a thickness no more than 10 nm.

In thirty-fifth examples, a transistor structure comprises a pillar or line over a substrate, the pillar or line comprising a gate electrode material. A gate dielectric material is adjacent to a sidewall of the pillar or line. A channel material is adjacent to the pillar or line with the gate dielectric material therebetween, wherein the channel material comprises $MS_x$, $MSe_x$, or $MTe_x$, wherein M a p-block or d-block element. A source contact metal and a drain contact metal are coupled to the channel material.

In thirty-sixth examples, for any of the thirty-fifth examples M comprises a p-block element.

In thirty-seventh examples, for any of the thirty-fifth through thirty-sixth examples M comprises at least one of Cu, Zn, Cd, Ni, Co, Pd, Pt, Ti, Cr, V, W Mo, Al, Sn, Ga, In, P, As, or Sb.

In thirty-eighth examples, a transistor structure comprises a pillar or line over a substrate, the pillar or line comprising a dielectric material. A channel material is adjacent to a sidewall of the pillar or line, wherein the channel material comprises $MS_x$, $MSe_x$, or $MTe_x$, wherein M a p-block or d-block element. A gate dielectric material is adjacent to the sidewall of the pillar or line with the channel material therebetween. A gate electrode material is adjacent to the sidewall of the pillar or line with the channel material and the gate dielectric material therebetween. A source contact metal and a drain contact metal are coupled to the channel material.

In thirty-ninth examples, for any of the thirty-eighth examples a lateral width of the channel material is no more than 10 nm and the height of the channel material is more than 10 nm.

In fortieth examples, for any of the thirty-eighth through thirty-ninth examples the height of the channel material is substantially equal to a height of each of the gate dielectric material and gate electrode material.

In forty-first examples, for any of the thirty-eighth through fortieth examples a foot of the channel material proximal to the substrate has a lateral dimension exceeding the lateral width of the channel material distal from the substrate.

In forty-second examples, a method of forming a transistor structure comprises depositing a first material comprising one or more p-block elements, converting at least a portion of the first material into a chalcogenide comprising the one or more p-block elements, forming a source contact metal and a drain contact metal, with at least the second material therebetween, and forming a gate electrode material separated from the second material by at least a gate dielectric material.

In forty-third examples, for any of the forty-second examples the first material further comprises oxygen, and converting at least a partial thickness of the first material into the chalcogenide further comprises replacing at least some of the oxygen with Se, S, or Te.

In forty-fourth examples, for any of the forty-second through forty-third examples depositing the first material comprises depositing the first material as a layer having a thickness less than 20 nm, and converting at least a partial thickness of the layer further comprises replacing the oxygen within an uppermost portion of the layer, the uppermost portion having a thickness of no more than 10 nm.

In forty-fifth examples for any of the forty-second through forty-fourth examples the method further comprises depositing a second material over the first material, and patterning the second material into seed structures. Converting the first material into the chalcogenide further comprises converting the seed structures into a different chalcogenide, and propagating from the different chalcogenide a conversion of the first material to the chalcogenide.

In forty-sixth examples, for any of the forty-fourth through forty-fifth examples the second material comprises less oxygen than the first material.

In forty-seventh examples, for any of the forty-fourth through forty-sixth examples the second material is predominantly a metal, and is substantially free of oxygen.

In forty-eighth examples, for any of the forty-fourth through forty-seventh examples forming the gate electrode material further comprises depositing a metal over a dielectric material of a substrate, and the method further comprises depositing the gate dielectric material directly on the gate electrode material, and depositing the first material over the gate dielectric material.

In forty-ninth examples, for any of the forty-forth through forty-eighth examples forming the gate electrode material further comprises depositing a metal over a dielectric material of a substrate. The method further comprises depositing the first material directly on the gate electrode material, and converting only a partial thickness of the layer by replacing the oxygen within only the uppermost portion of the layer.

In fiftieth examples, for any of the forty-second through forty-ninth examples the one or more elements from Groups III or V comprise Ga.

In fifty-first examples, for any of the forty-second through fiftieth examples depositing the first material comprising the one or more p-block elements further comprises depositing a metal substantially free of oxygen, and converting at least a partial thickness of the first material further comprises reacting the metal with Se, S or Te.

In fifty-second examples, a method of forming an integrated circuit (IC) die, the method comprises forming in the substrate a plurality of complementary metal-oxide-semiconductor (CMOS) field effect transistor (FET) structures, wherein individual ones of the CMOS FET structures comprise a Group IV semiconductor material. The method further comprises forming plurality of back-end transistor structures over the CMOS FET structures, with one or more levels of interconnect metallization therebetween. Forming individual ones of the back-end transistor structures comprises the method of any of the forty-second through fifty-first examples.

In fifty-third examples, a method of forming a transistor structure comprises depositing a first material comprising oxygen and one or more d-block or p-block elements, converting only a portion of the first material into a second material comprising a chalcogen and the one or more d-block or p-block elements, forming a source contact metal and a drain contact metal, with both the first and the second material therebetween, and forming a gate electrode material separated from the second material by at least a gate dielectric material.

In fifty-fourth examples, for any of the fifty-third examples the first and second materials have n-type conductivity.

In fifty-fifth examples, for any of the fifty-third through fifty-fourth examples the first material is an oxide of Cu, Zn, Cd, Ni, Co, Pd, Pt, Ti, Cr, V, W Mo, Al, Sn, Ga, In, P, As, or Sb, the converting comprises exposing the first material to a gas comprising S, Se, or Te, and at least one of H and O.

In fifty-sixth examples, for any of the fifty-third through fifty-fifth examples the method further comprises forming a non-planar body in a substrate material, depositing the first material over a sidewall of the non-planar body, and converting an exterior portion of the first material into the second material.

In fifty-seventh examples, a method of forming an integrated circuit (IC) die comprises forming in the substrate a plurality of complementary metal-oxide-semiconductor (CMOS) field effect transistor (FET) structures, wherein individual ones of the CMOS FET structures comprise a Group IV semiconductor material. The method further comprises forming plurality of back-end transistor structures over the CMOS FET structures, with one or more levels of interconnect metallization therebetween. Forming individual ones of the back-end transistor structures comprises the method in any of the fifty-third through fifty-sixth examples.

In fifty-eighth examples, a method of forming a transistor structure comprises patterning a material stack comprising a source contact metal, a drain contact metal, and an intervening dielectric material therebetween. The method comprises depositing a first material over a sidewall of the material stack, wherein the first material comprises at least one of Cu, Zn, Cd, Ni, Co, Pd, Pt, Ti, Cr, V, W Mo, Al, Sn, Ga, In, P, As, or Sb, and converting at least a portion of the first material into a second material comprising $MS_x$, $MSe_x$, or $MTe_x$. The method further comprises forming a gate electrode material adjacent to the second material with at least a gate dielectric material therebetween.

In fifty-ninth examples, for any of the fifty-eighth examples forming the gate electrode material further comprises depositing the gate dielectric material over a sidewall of the second material, and depositing the gate electrode over a sidewall of the gate dielectric material.

In sixtieth examples, a method of forming an integrated circuit (IC) die comprises forming in the substrate a plurality of complementary metal-oxide-semiconductor (CMOS) field effect transistor (FET) structures, wherein individual ones of the CMOS FET structures comprise a Group IV semiconductor material. The method further comprises forming plurality of back-end transistor structures over the CMOS FET structures, with one or more levels of interconnect metallization therebetween. Forming individual ones of the back-end transistor structures comprises the method of any of the fifty-eighth through fifty-ninth examples.

In sixty-first examples, a method of forming a transistor structure comprises depositing a gate electrode material, and depositing a gate dielectric material over the gate electrode material, wherein the gate dielectric material comprises oxygen and one or more elements M. The method comprises converting a portion of the gate dielectric material into a second material comprising $MS_x$, $MSe_x$, or $MTe_x$. The method further comprises forming a source contact metal and a drain contact metal coupled to the second material.

In sixty-second examples, for any of the sixty-first examples the one or more elements M comprise Ga or W, and the chalcogen comprises at least one of Se or S.

In sixty-third examples, for any of the sixty-first through sixty-second examples forming the source contact metal and the drain contact metal further comprises depositing, onto a dielectric material, a first of the source contact metal and the drain contact metal. Depositing the gate electrode material further comprises depositing the gate electrode material over the first of the source contact metal and the drain contact metal. Depositing the gate dielectric material over the gate electrode material further comprises depositing the gate dielectric material adjacent to a sidewall of the gate electrode material.

In sixty-fourth examples, a method of forming an integrated circuit (IC) die, the method comprises forming in the substrate a plurality of complementary metal-oxide-semiconductor (CMOS) field effect transistor (FET) structures, wherein individual ones of the CMOS FET structures comprise a Group IV semiconductor material. The method comprises forming plurality of back-end transistor structures over the CMOS FET structures, with one or more levels of interconnect metallization therebetween. Forming individual ones of the back-end transistor structures comprises the method in the sixty-third examples.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
   a first semiconductor material of a first composition comprising one or more d-block or p-block metals;
   a second semiconductor material of a first thickness and of a second composition, different than the first composition, in contact with the first semiconductor material, wherein at least the second semiconductor material comprises a chalcogen, and one or more d-block or p-block metals;
   a source contact metal and a drain contact metal electrically coupled to both the first and second semiconductor materials therebetween, wherein each of the source contact metal and the drain contact metal extends through the first thickness of the second semiconductor material and is in contact with the first semiconductor material; and
   a gate electrode material separated from the second semiconductor material by at least a gate dielectric material, the gate electrode material to control a channel region within at least one of the first or second semiconductor materials.

2. The transistor structure of claim 1, wherein:
   the first semiconductor material further comprises oxygen;
   the first and second semiconductor materials both comprise the same one or more metals; and
   the source contact metal is electrically coupled to the drain contact metal by a channel region within each of the first and second semiconductor materials.

3. The transistor structure of claim 1, wherein
   the first semiconductor material further comprises a chalcogen; and
   the first and second semiconductor materials comprise different metals.

4. The transistor structure of claim 3, wherein the first semiconductor material has a first conductivity type and the second semiconductor material has a second conductivity type, complementary to the first conductivity type.

5. The transistor structure of claim 1, wherein the first and second semiconductor materials comprise at least one of Zn, Cd, Al, Sn, Ga, In, P, As, or Sb.

6. The transistor structure of claim 5, wherein the chalcogen comprises S or Se, and wherein the first semiconductor material comprises $MS_x$, $MSe_x$, or $MTe_x$, where M is the metal and x is between 0.2 and 4.

7. The transistor structure of claim 1, wherein:
   the first semiconductor material is over a substrate dielectric material;
   the second semiconductor material is over the first semiconductor material;
   the gate dielectric material is over the second semiconductor material; and
   the gate electrode material is over the gate dielectric material.

8. The transistor structure of claim 7, wherein:
   a non-planar body comprises the substrate dielectric material; and
   the first and second materials, the gate dielectric material, and the gate electrode material are adjacent to a sidewall of the non-planar body.

9. An integrated circuit (IC) die, comprising:
   a plurality of complementary metal-oxide-semiconductor (CMOS) field effect transistor (FET) structures, wherein individual ones of the CMOS FET structures comprise a Group IV semiconductor material;
   a plurality of back-end transistor structures over the CMOS FET structures, with one or more levels of interconnect metallization therebetween, wherein individual ones of the back-end transistor structures comprise the transistor structure of claim 1.

10. The transistor structure of claim 1, wherein the d-block or p-block metal comprises Zn.

11. The transistor structure of claim 10, wherein the d-block or p-block metal comprises $In_y$, $Ga_z$, and $Zn_{1-y-z}$ and wherein y and z are both greater than 0, but sum to less than 1.

12. The transistor structure of claim 1, wherein the gate dielectric comprises predominantly oxygen and Ga or W.

13. The transistor structure of claim 1, wherein:
   the gate electrode material is a first gate electrode material within a stack of materials comprising the first and second semiconductor materials and further comprising a second gate electrode material;
   the second semiconductor material is between the first semiconductor material and the first gate electrode material; and
   the first semiconductor material is between the second semiconductor material and the second gate electrode material.

14. The transistor structure of claim 13, wherein the gate dielectric material is a first gate dielectric material and the stack of materials further comprises a second gate dielectric material between the first semiconductor material and the second gate electrode material.

15. The transistor structure of claim 13, wherein:
the first semiconductor material comprises oxygen; and
the first and second semiconductor materials both comprise the same one or more metals.

16. The transistors structure of claim 1, wherein the second semiconductor material is in contact with the first semiconductor material over an entirety of the channel region.

17. The transistor structure of claim 1, wherein the first semiconductor material has a second thickness and wherein each of the source contact metal and the drain contact metal extends through the second thickness of the first semiconductor material.

18. The transistor structure of claim 1, wherein the gate electrode material is one of one or more gate electrode materials that are to control a channel region within each of the first and second semiconductor materials.

19. The transistor structure of claim 1, wherein the channel region is within the second semiconductor material, and wherein the second semiconductor material has a thickness of less than 10 nm.

* * * * *